(12) United States Patent
Aoki

(10) Patent No.: US 10,802,407 B2
(45) Date of Patent: Oct. 13, 2020

(54) EXPOSURE APPARATUS, EXPOSURE METHOD, MANUFACTURING METHOD OF FLAT-PANEL DISPLAY, AND DEVICE MANUFACTURING METHOD

(71) Applicant: NIKON CORPORATION, Tokyo (JP)

(72) Inventor: Yasuo Aoki, Zushi (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/763,475

(22) PCT Filed: Sep. 29, 2016

(86) PCT No.: PCT/JP2016/078851
§ 371 (c)(1),
(2) Date: Mar. 27, 2018

(87) PCT Pub. No.: WO2017/057590
PCT Pub. Date: Apr. 6, 2017

(65) Prior Publication Data
US 2019/0049856 A1 Feb. 14, 2019

(30) Foreign Application Priority Data
Sep. 30, 2015 (JP) ................. 2015-192794

(51) Int. Cl.
*G03F 7/20* (2006.01)
*H01L 21/68* (2006.01)
(Continued)

(52) U.S. Cl.
CPC ...... *G03F 7/70358* (2013.01); *G03F 7/70525* (2013.01); *G03F 7/70616* (2013.01);
(Continued)

(58) Field of Classification Search
CPC ............ G03F 7/70358; G03F 7/70716; G03F 7/70725; G03F 7/70758; G03F 7/70791; G02F 1/1303
See application file for complete search history.

(56) References Cited

U.S. PATENT DOCUMENTS

| 5,729,331 A | 3/1998 | Tanaka et al. |
| 6,552,775 B1 | 4/2003 | Yanagihara et al. |
| (Continued) | | |

FOREIGN PATENT DOCUMENTS

| JP | 2006-330534 A | 12/2006 |
| JP | 2011-044713 A | 3/2011 |

OTHER PUBLICATIONS

Dec. 20, 2016 International Search Report issued in International Patent Application No. PCT/JP2016/078851.
(Continued)

*Primary Examiner* — Michelle M Iacoletti
(74) *Attorney, Agent, or Firm* — Oliff PLC

(57) ABSTRACT

A substrate stage device of an exposure apparatus is equipped with: a noncontact holder that supports, in a noncontact manner, a first area and at least a partial area of a second area, of a substrate, the second area being arranged side by side with the first area in the Y-axis direction; a substrate carrier that holds the substrate held in a noncontact manner by the noncontact holder, at a position not overlapping the noncontact holder in the X-axis direction; Y linear actuators and Y voice coil motors that relatively move the substrate carrier with respect to the noncontact holder in the Y-axis direction; X voice coil motors that move the substrate carrier in the X-axis direction; and actuators that move the noncontact holder in the X-axis direction.

19 Claims, 26 Drawing Sheets

(51) Int. Cl.
*G03F 7/00* (2006.01)
*G03F 7/30* (2006.01)

(52) U.S. Cl.
CPC ...... *G03F 7/70716* (2013.01); *G03F 7/70725* (2013.01); *G03F 7/70758* (2013.01); *G03F 7/70791* (2013.01); *H01L 21/68* (2013.01); *H01L 21/682* (2013.01); *G03F 7/0007* (2013.01); *G03F 7/30* (2013.01)

(56) References Cited

U.S. PATENT DOCUMENTS

| | | |
|---|---|---|
| 2008/0030702 A1 | 2/2008 | Kawamura |
| 2008/0094592 A1 | 4/2008 | Shibazaki |
| 2010/0018950 A1 | 1/2010 | Aoki et al. |
| 2010/0266961 A1 | 10/2010 | Kawamura et al. |
| 2011/0042874 A1 | 2/2011 | Aoki et al. |

OTHER PUBLICATIONS

Dec. 20, 2016 Written Opinion issued in International Patent Application No. PCT/JP2016/078851.
May 25, 2020 Office Action issued in Japanese Patent Application No. 2017-543569.
Jul. 23, 2020 Office Action issued in Taiwanese Patent Application No. 105131979.

EXPOSURE APPARATUS, EXPOSURE METHOD, MANUFACTURING METHOD OF FLAT-PANEL DISPLAY, AND DEVICE MANUFACTURING METHOD

TECHNICAL FIELD

The present invention relates to exposure apparatuses, exposure methods, manufacturing methods of flat-panel displays and device manufacturing methods.

BACKGROUND ART

Conventionally, in a lithography process for manufacturing electronic devices (micro devices) such as liquid crystal display devices and semiconductor devices (integrated circuits and the like), used are exposure apparatuses such as an exposure apparatus of a step-and-scan method (a so-called scanning stepper (which is also called a scanner)) that, while synchronously moving a mask or a reticle (hereinafter, generically referred to as a "mask") and a glass plate or a wafer (hereinafter, generically referred to as a "substrate") along a predetermined scanning direction, transfers a pattern formed on the mask onto the substrate using an energy beam.

As this type of exposure apparatuses, such an exposure apparatus is known that a substrate holder that holds a substrate is finely driven in directions of three degrees of freedom within a horizontal plane (a scanning direction, a cross-scanning direction and a rotation direction within the horizontal plane) in order to perform positioning of the substrate with high speed and high accuracy (e.g., refer to PTL 1).

Here, the positioning control of the substrate has tended to be difficult because the substrate holder increases in size and thus in weight due to the increase in size of the substrate in recent years.

CITATION LIST

Patent Literature

[PTL 1] U.S. Patent Application Publication No. 2010/0266961

SUMMARY OF INVENTION

According to a first aspect of the present invention, there is provided an exposure apparatus that performs scanning exposure of each of a plurality of areas of an object, by irradiating the object with an illumination light via an optical system and relatively driving the object with respect to the illumination light, the apparatus comprising: a first support section that supports, in a noncontact manner, a first area and at least a partial area of a second area of the plurality of areas, the second area being arranged side by side with the first area in a first direction; a holding section that holds the object supported in a noncontact manner by the first support section, at a position not overlapping the first support section in a second direction intersecting the first direction; and a first drive section disposed spaced apart from the first support section in the second direction, the first drive section relatively driving the holding section that holds the object with respect to the first support section in the first direction so that an other area of the second area is supported by the first support section.

According to a second aspect of the present invention, there is provided an exposure apparatus that performs scanning exposure of each of a plurality of areas of an object, by irradiating the object with an illumination light and relatively moving the object with respect to the illumination light in a first direction, the apparatus comprising: a first support section that supports, in a noncontact manner, at least a first area of the plurality of areas; a holding section that holds the object supported in a noncontact manner by the first support section; a second drive system that relatively drives the holding section with respect to the first support section so that a part of the first area moves off from the first support section, in one direction of the first direction and a second direction, the second direction intersecting the first direction; and a second drive system that drives the first support section, in an other direction of the first direction and the second direction.

According to a third aspect of the present invention, there is provided an exposure apparatus that performs scanning exposure of an object, by irradiating the object with an illumination light via an optical system and relatively driving the object with respect to the illumination light, the apparatus comprising: a first support section that supports a substantially entire surface of the object in a noncontact manner; a holding section that holds the object supported in a noncontact manner by the first support section; and a drive section that relatively drives the holding section with respect to first support section, wherein the drive section relatively drives the holding section that holds the object whose substantially entire surface is supported in a noncontact manner by the first support section, with respect to an area, in the object, irradiated with the illumination light, so that a partial portion of the object moves off from the first support section.

According to a fourth aspect of the present invention, there is provided a manufacturing method of a flat-panel display, comprising: exposing the object using the exposure apparatus related to any one of the first to the third aspects; and developing the object that has been exposed.

According to a fifth aspect of the present invention, there is provided a device manufacturing method, comprising: exposing the object using the exposure apparatus related to any one of the first to the third aspects; and developing the object that has been exposed.

According to a sixth aspect of the present invention, there is provided an exposure method of performing scanning exposure of each of a plurality of areas of an object, by irradiating the object with an illumination light via an optical system and relatively driving the object with respect to the illumination light, the method comprising: supporting, in a noncontact manner, a first area and at least a partial area of a second area of the plurality of areas, by a first support section, the second area being arranged side by side with the first area in a first direction; holding the object supported by the first support section in a noncontact manner, by a holding section at a position not overlapping the first support section in a second direction intersecting the first direction; and relatively driving the holding section that holds the object with respect to the first support section, by a first drive section, so that an other area of the second area is supported by the first support section, the first drive section being disposed spaced apart from the first support section in the second direction.

According to a seventh aspect of the present invention, there is provided an exposure method of performing scanning exposure of each of a plurality of areas of an object, by irradiating the object with an illumination light and relatively moving the object with respect to the illumination light in a first direction, the method comprising: supporting, in a noncontact manner, at least a first area of the plurality of areas, by a first support section; holding the object supported by the first support section in a noncontact manner, by a holding section; relatively driving the holding section with respect to the first support section so that a part of the first area moves off from the first support section, in one direction of the first direction and a second direction intersecting the first direction; and driving the first support section in an other direction of the first direction and the second direction.

According to an eighth aspect of the present invention, there is provided an exposure method of performing scanning exposure of an object, by irradiating the object with an illumination light via an optical system and relatively driving the object with respect to the illumination light, the method comprising: supporting a substantially entire surface of the object in a noncontact manner, by a first support section; holding the object supported by the first support section in a noncontact manner, by a holding section; and relatively driving the holding section with respect to first support section, wherein in the relatively driving, the holding section that holds the object whose substantially entire surface is supported in a noncontact manner by the first support section is relatively driven with respect to an area, in the object, irradiated with the illumination light, so that a partial portion of the object moves off from the first support section.

BRIEF DESCRIPTION OF DRAWINGS

FIG. 26b is a cross-sectional view taken along the line B-B shown in FIG. 26a.

DESCRIPTION OF EMBODIMENTS

First Embodiment

A first embodiment will be described below, using FIGS. 1 to 9b.

Figure 1:
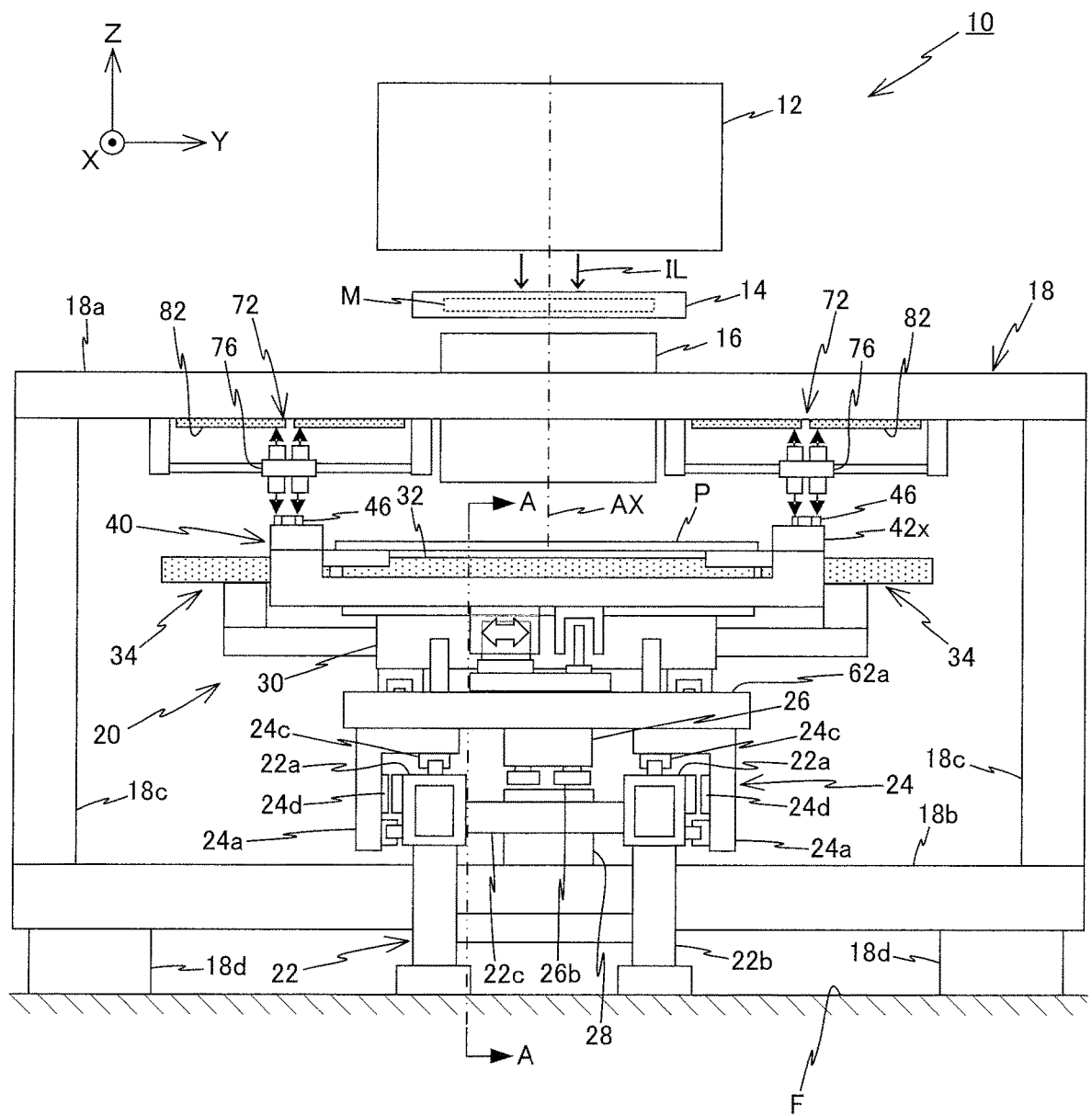
FIG. 1 is a view schematically showing a configuration of a liquid crystal exposure apparatus related a first embodiment.

FIG. 1 schematically shows the configuration of a liquid crystal exposure apparatus 10 related to the first embodiment. Liquid crystal exposure apparatus 10 is a projection exposure apparatus of a step-and-scan method, which is a so-called scanner, with a rectangular (square) glass substrate P (hereinafter, simply referred to as a substrate P) used in, for example, a liquid crystal display device (a flat-panel display) or the like, serving as an object to be exposed.

Liquid crystal exposure apparatus 10 has: an illumination system 12; a mask stage 14 to hold a mask M on which patterns such as a circuit pattern are formed; a projection optical system 16; an apparatus main body 18; a substrate stage device 20 to hold substrate P whose surface (a surface facing the +Z side in FIG. 1) is coated with resist (sensitive agent); a control system thereof; and the like. Hereinafter, the explanation is given assuming that a direction in which mask M and substrate P are each scanned relative to projection optical system 16 at the time of exposure is an X-axis direction, a direction orthogonal to the X-axis within a horizontal plane is a Y-axis direction, and a direction orthogonal to the X-axis and the Y-axis is a Z-axis direction. Further, the explanation is given assuming that rotation directions around the X-axis, the Y-axis and the Z-axis are a θx direction, a θy direction and a θz direction, respectively.

Illumination system 12 is configured similarly to an illumination system disclosed in, for example, U.S. Pat. No. 5,729,331 and the like. That is, illumination system 12 irradiates mask M with light emitted from a light source (not illustrated) (e.g. a mercury lamp), as illumination light for exposure (illumination light) IL, via a reflection mirror, a dichroic mirror, a shutter, a wavelength selecting filter, various types of lenses and the like (none of which are illustrated). As illumination light IL, light such as, for example, an i-line (with wavelength of 365 nm), a g-line (with wavelength of 436 nm), and an h-line (with wavelength of 405 nm) (or synthetic light of the i-line, the g-line and the h-line described above) is used.

Mask stage 14 holds mask M of a light-transmitting type. Main controller 50 (see FIG. 6) drives mask stage 14 (i.e. mask M) with a predetermined long stroke relative to illumination system 12 (illumination light IL) in the X-axis direction (the scanning direction), and also finely drives mask stage 14 in the Y-axis direction and the θz direction, via a mask stage drive system 52 (see FIG. 6) including, for example, a liner motor. Position information of mask stage 14 within the horizontal plane is obtained by a mask stage position measurement system 54 (see FIG. 6) including, for example, a laser interferometer.

Projection optical system 16 is disposed below mask stage 14. Projection optical system 16 is a so-called multi-lens type projection optical system having a configuration similar to a projection optical system disclosed in, for example, U.S. Pat. No. 6,552,775 and the like, and projection optical system 16 is equipped with a plurality of optical systems that are, for example, both-side telecentric and form erected normal images. An optical axis AX of illumination light IL projected on substrate P from projection optical system. 16 is substantially parallel to the Z-axis.

In liquid crystal exposure apparatus 10, when mask M located in an illumination area is illuminated with illumination light IL from illumination system 12, by illumination light IL that has passed through mask M, a projected image of a pattern (a partial image of the pattern) of mask M within the illumination area is formed on an exposure area on substrate P, via projection optical system 16. Then, mask M is moved relative to the illumination area (illumination light IL) in the scanning direction and also substrate P is moved relative to the exposure area (illumination light IL) in the scanning direction, and thereby the scanning exposure of one shot area on substrate P is performed and the pattern formed on mask M (the entire pattern corresponding to the scanning range of mask M) is transferred onto the shot area. Here, the illumination area on mask M and the exposure area (an irradiation area of the illumination light) on substrate P are in a relationship optically conjugate with each other by projection optical system 16.

Apparatus main body 18 is a section that supports mask stage 14 and projection optical system 16 that are described above, and is installed on a floor F of a clean room via a plurality of vibration isolating devices 18d. Apparatus main body 18 is configured similarly to an apparatus main body as disclosed in, for example, U.S. Patent Application Publication No. 2008/0030702, and apparatus main body 18 has: an upper mount section 18a (which is also referred to as an optical surface plate) that supports projection optical system 16 described above; a pair of lower mount sections 18b (one of which is not illustrated in FIG. 1 because the pair of lower mount sections 18b overlap in a depth direction of the paper surface. See FIG. 2); and a pair of middle mount sections 18c.

Substrate stage device 20 is a section that performs the high accuracy positioning of substrate P relative to projection optical system 16 (illumination light IL), and substrate stage device 20 drives substrate P with a predetermined long stroke along the horizontal plane (the X-axis direction and the Y-axis direction), and also finely drives substrate P in directions of six degrees of freedom. Substrate stage device 20 is equipped with a base frame 22, a coarse movement stage 24, a weight cancelling device 26, an X guide bar 28, a substrate table 30, a noncontact holder 32, a pair of auxiliary tables 34, a substrate carrier 40 and the like.

Base frame 22 is equipped with a pair of X beams 22a. X beam 22a is made up of a member with a rectangular YZ cross-sectional shape extending in the X-axis direction. The pair of X beams 22a are disposed at a predetermined spacing in the Y-axis direction, and the pair of X beams 22 are each installed on floor F via a leg section 22b, in a state of being physically separated (vibrationally isolated) from apparatus main body 18. Each of the pair of X beams 22a and each of leg sections 22b are integrally coupled by a coupling member 22C.

Coarse movement stage 24 is a section for driving substrate P with a long stroke in the X-axis direction, and coarse movement stage 24 is equipped with a pair of X carriages 24a, corresponding to the pair of X beams 22a described above. X carriage 24a is formed into an inversed L-like YZ cross-sectional shape, and is placed on the corresponding X beam 22a via a plurality of mechanical linear guide devices 24c.

Figure 2:
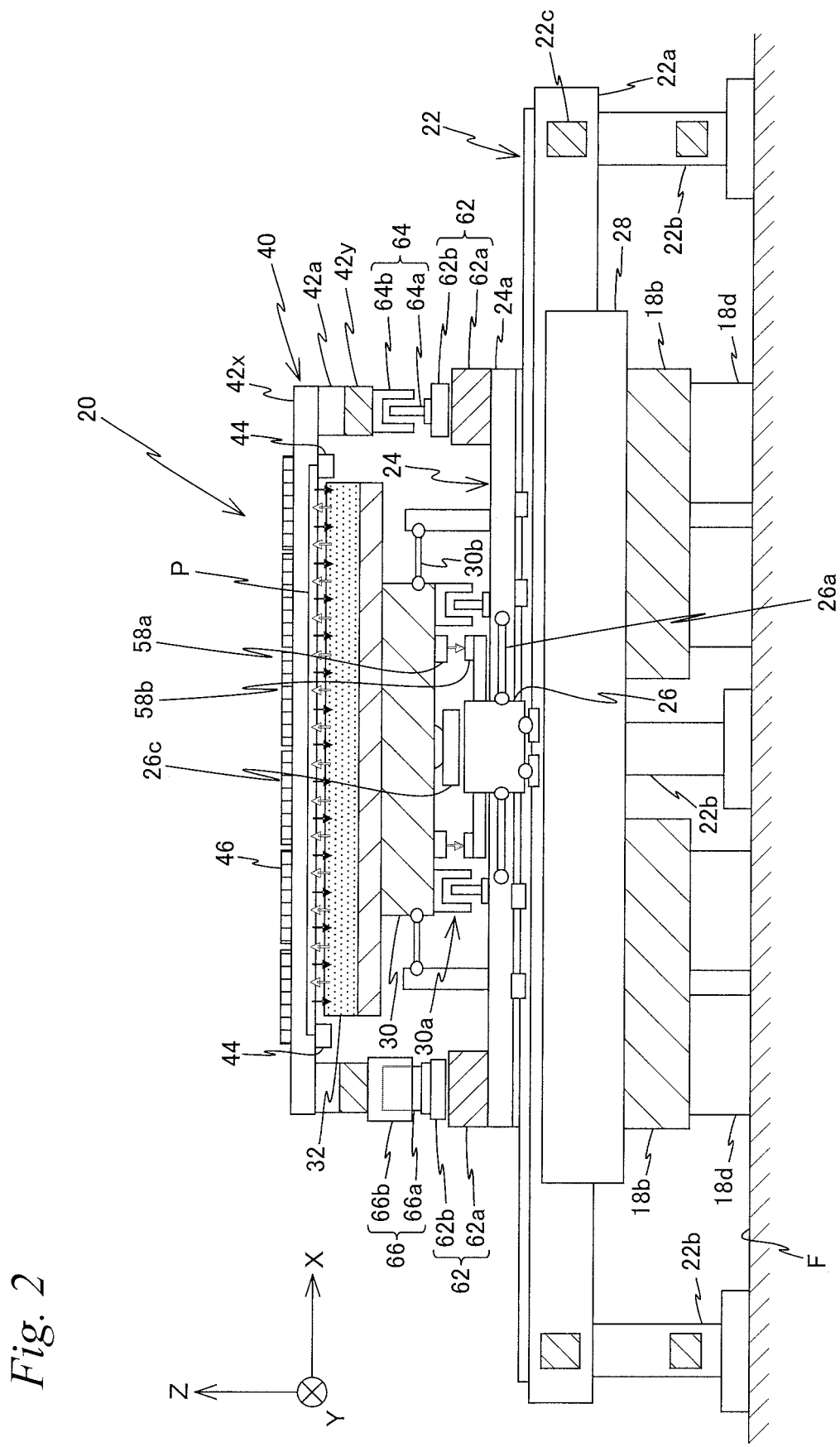
FIG. 2 is a cross-sectional view taken along the line A-A shown in FIG.1.

The pair of X carriages 24a are synchronously driven with a predetermined long stroke in the X-axis direction (about 1 time to 1.5 times the length of substrate P in the X-axis direction) along the respective corresponding X beams 22a, by main controller 50 (see FIG. 6) via an X linear actuator that is a part of a substrate table drive system 56 (see FIG. 6) for driving substrate table 30. The type of the X linear actuator for driving X carriage 24a can be changed as needed. In FIG. 2, for example, a linear motor 24d including a mover that X carriage 24a has and a stator that the corresponding X beam 22a has is used, but this is not intended to be limiting, and for example, a feed screw (a ball screw) device or the like may be used.

Further, as illustrated in FIG. 2, coarse movement stage 24 has a pair of Y stators 62a. Y stators 62a are made up of members extending in the Y-axis direction (see FIG. 1). One of Y stators 62a and the other of Y stators 62a bridge on the pair of X carriages 24a, respectively, at the +X side end vicinity part of coarse movement stage 24 and the −X side end vicinity part of coarse movement stage 24a (see FIG. 1). The functions of Y stators 62a will be described later.

Weight cancelling device 26 is inserted between the pair of X carriages 24a that coarse movement stage 24 has, and supports the empty weight of a system including substrate table 30 and noncontact holder 32, from below. Since the details of weight cancelling device 26 are disclosed in, for example, U.S. Patent Application Publication No. 2010/0018950, the description thereof will be omitted. Weight cancelling device 26 is mechanically coupled to coarse movement stage 24, via a plurality of coupling devices 26a (which are also referred to as flexure devices) radially extending from weight cancelling device 26, and weight cancelling device 26 is towed by coarse movement stage 24, thereby being moved integrally with coarse movement stage 24 in the X-axis direction. Note that, although weight cancelling device 26 is to be coupled to coarse movement stage 24 via coupling devices 26a radially extending from weight cancelling device 26, such a configuration may also be employed that weight cancelling device 26 is coupled by coupling devices 26a extending in the X direction in order to be moved only in the X-axis direction.

X guide bar 28 is a section that functions as a surface plate when weight cancelling device 26 is moved. X guide bar 28 is made up of a member extending in the X-axis direction, and as illustrated in FIG. 1, X guide bar 28 is inserted between the pair of X beams 22a that base frame 22 has, and is fixed on the pair of lower mount sections 18b that apparatus main body 18 has. The center of X guide bar 28 in the Y-axis direction substantially coincides with the center of the exposure area generated on substrate P by illumination light IL in the Y-axis direction. The upper surface of X guide bar 28 is set parallel to the XY plane (the horizontal plane). Weight cancelling device 26 described above is placed on X guide bar 28 in a noncontact state, for example, via air bearings 26b. When coarse movement stage 24 is moved in the X-axis direction on base frame 22, weight cancelling device 26 is moved in the X-axis direction on X guide bar 28.

Substrate table 30 is made up of a plate-like (or box-like) member having a rectangular shape with the X-axis direction serving as a longitudinal direction in planar view, and as illustrated in FIG. 2, is supported in a noncontact manner from below by weight cancelling device 26 in a state where the central part is freely swingable with respect to the XY plane via a spherical bearing device 26c. Further, as illustrated in FIG. 1, the pair of auxiliary tables 34 (not illustrated in FIG. 2) are coupled to substrate table 30. The functions of the pair of auxiliary tables 34 will be described later.

Referring back to FIG. 2, substrate table 30 is finely driven as needed relative to coarse movement stage 24, in directions intersecting the horizontal plane (the XY plane), i.e., the Z-axis direction, the θx direction and the θy direction (hereinafter, referred to Z-tilt directions), by a plurality of linear motors 30a (e.g. voice coil motors) that are a part of substrate table drive system 56 (see FIG. 6) and include stators that coarse movement stage 24 has and movers that substrate table 30 itself has.

Substrate table 30 is mechanically coupled to coarse movement stage 24 via a plurality of coupling devices 30b (flexure devices) radially extending from substrate table 30. Coupling devices 30b include, for example, boll joints, and are arranged so as not to block the relative movement of substrate table 30 with a fine stroke with respect to coarse movement stage 24 in the Z-tilt directions. Further, in the case when coarse movement stage 24 is moved with a long stroke in the X-axis direction, substrate table 30 is towed by coarse movement stage 24 via the plurality of coupling devices 30b, and thereby coarse movement stage 24 and substrate table 30 are integrally moved in the X-axis direction. Note that since substrate table 30 is not moved in the Y-axis direction, substrate table 30 may be coupled to coarse movement stage 24 via a plurality of coupling devices 30b parallel to the X-axis direction, instead of coupling devices 30b radially extending to coarse movement stage 24.

Noncontact holder 32 is made up of a plate-like (or box-like) member having a rectangular shape with the X-axis direction serving as a longitudinal direction in planar view, and supports substrate P from below with its upper surface. Noncontact holder 32 has a function of preventing the sag, wrinkle or the like of substrate P from being generated (of performing flatness correction of substrate P). Noncontact holder 32 is fixed to the upper surface of substrate table 30, and is moved with a long stroke integrally with substrate table 30 described above in the X-axis direction and is also finely moved in the Z-tilt directions.

The length of each of the four sides of the upper surface (the substrate supporting surface) of noncontact holder 32 is set substantially the same as (actually, slightly shorter than) the length of each of the four sides of substrate P. Consequently, noncontact holder 32 can support substantially the entirety of substrate P from below, or more specifically, can support an area to be exposed on substrate P (an area excluding margin areas that are formed at the end vicinity parts of substrate P) from below.

A pressurized gas supply device and a vacuum suction device (not illustrated) that are installed external to substrate stage device 20 are coupled to noncontact holder 32 via piping members such as, for example, tubes. Further, a plurality of minute hole sections that communicate with the piping members referred to above are formed on the upper surface (the substrate placing surface) of noncontact holder 32. Noncontact holder 32 blows out the pressurized gas (e.g. the compressed air) supplied from the pressurized gas supply device described above to the lower surface of substrate P via (apart of) the hole sections, thereby levitating substrate P. Further, together with the blowing-out of the pressurized gas described above, noncontact holder 32 suctions the air between the lower surface of substrate P and the substrate supporting surface by a vacuum suction force supplied from the vacuum suction device described above. Accordingly, the load (the preload) acts on substrate P, and the flatness correction of substrate P is performed along the upper surface of noncontact holder 32. However, the relative movement of substrate P and noncontact holder 32 in directions parallel to the horizontal plane is not blocked because a gap is formed between substrate P and noncontact holder 32.

Substrate carrier 40 is a section that holds substrate P, and moves substrate P relative to illumination light IL (see FIG. 1) in directions of three degrees of freedom within the horizontal plane (the X-axis direction, the Y-axis direction and the θz direction). Substrate carrier 40 is formed into a rectangular frame-like (a picture-frame-like) shape in planar view, and is moved relative to noncontact holder 32 along the XY plane in a state of holding the areas (the margin areas) at the end vicinity parts (the outer periphery edges) of substrate P. The details of substrate carrier 40 will be described below using FIG. 3.

Figure 3:
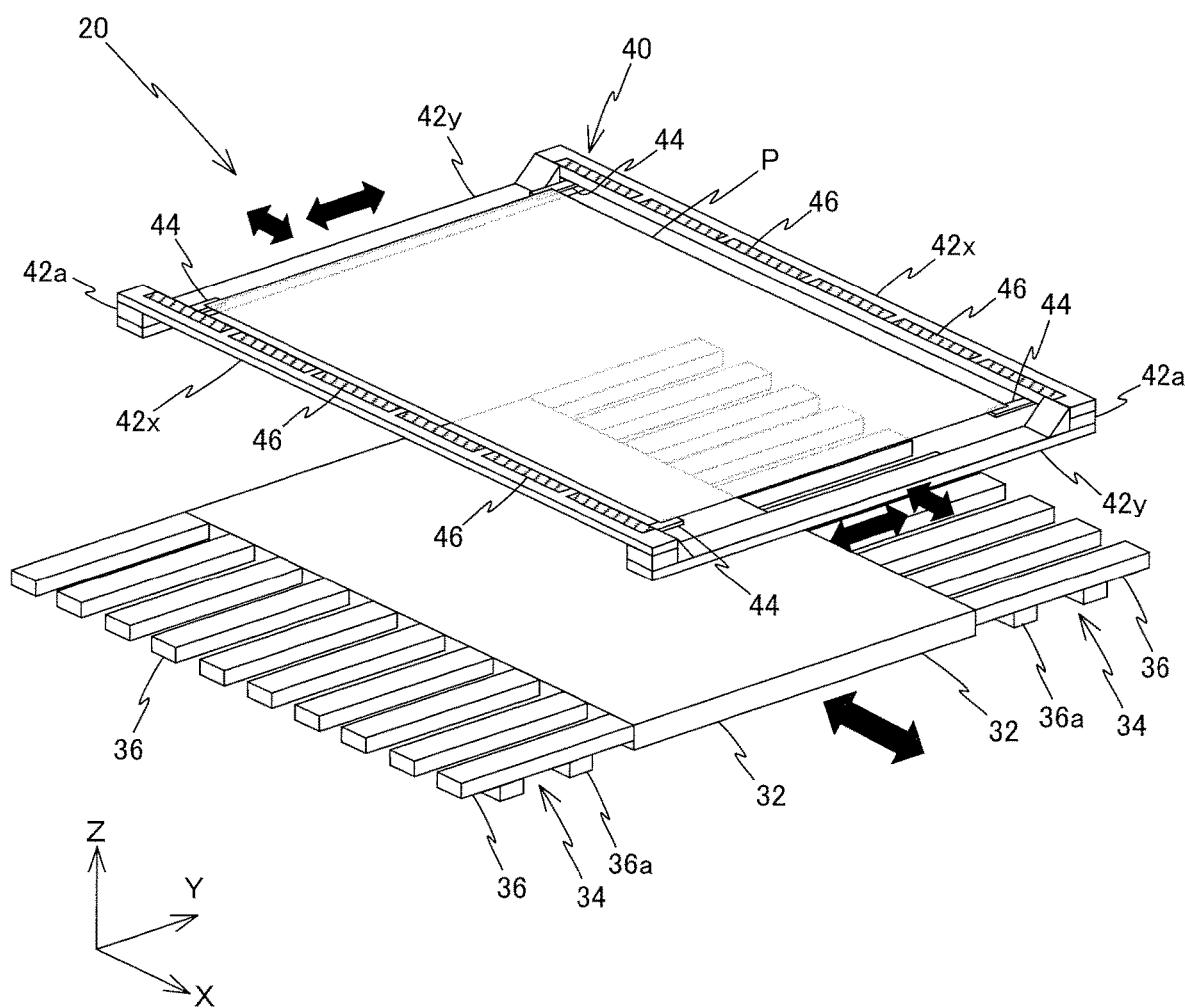
FIG. 3 is a view showing the details of a substrate stage device equipped in the liquid crystal exposure apparatus shown in FIG. 1.

As illustrated in FIG. 3, substrate carrier 40 is equipped with a pair of X frames 42x and a pair of Y frames 42y. The pair of X frames 42x are each made up of a tabular member extending in the X-axis direction, and are disposed at a predetermined spacing in the Y-axis direction (the spacing wider than the size of substrate P and the size of noncontact holder 32 in the Y-axis direction). Further, the pair of Y frames 42y are each made up of a tabular member extending in the Y-axis direction, and are disposed at a predetermined spacing in the X-axis direction (the spacing wider than the size of substrate P and the size of noncontact holder 32 in the X-axis direction).

Y frame 42y on the +X side is coupled, via a spacer 42a, to the lower surface of the +X side end vicinity part of each of the pair of X frames 42x. Similarly, Y frame 42y on the −X side is coupled, via a spacer 42a, to the lower surface of the −X side end vicinity part of each of the pair of X frames 42x. Accordingly, the height positions (the positions in the Z-axis direction) of the upper surfaces of the pair of Y frames 42y are set lower (on the −Z side) than the height positions of the lower surface of the pair of X frames 42x.

Further, on the lower surface of each of the pair of X frames 42x, a pair of adsorption pads 44 are attached, spaced apart from each other in the X-axis direction. Consequently, substrate carrier 40 has, for example, four adsorption pads 44 in total. Adsorption pads 44 are disposed protruding from the surfaces of the pair of X frames 42x facing each other, toward directions opposing to each other (the inner sides of substrate carrier 40). For example, the positions of the four adsorption pads 44 within the horizontal plane (the attached positions with respect to X frames 42x) are set so that the four adsorption pads 44 can support the four corner vicinity parts (the margin areas) of substrate P from below in a state where substrate P is inserted between the pair of X frames 42x. For example, a vacuum suction device (not illustrated) is coupled to each of the four adsorption pads 44. Adsorption pads 44 adsorb and hold the lower surface of substrate P by vacuum suction forces supplied from the vacuum suction devices descried above. Note that the number of adsorption pads 44 is not limited to four, but can be changed as needed.

Here, as illustrated in FIG. 2, in a state where noncontact holder 32 and substrate carrier 40 are combined, the four corner vicinity parts of substrate P are supported (held by adsorption) from below by adsorption pads 44 that substrate carrier 40 has, and also the substantially entire surface including the central part of substrate P is supported from below by noncontact holder 32 in a noncontact manner. In this state, the +X side end and the −X side end of substrate P protrude from the +X side end and the −X side end of noncontact holder 32, and for example, the four adsorption pads 44 (a part of which is not illustrated in FIG. 2) adsorb and hold the portions of substrate P protruding from noncontact holder 32. That is, the attached positions of adsorption pads 44 with respect to X frames 42x are set so that adsorption pads 44 are located on the outer side with respect to noncontact holder 32 in the X-axis direction.

Next, a substrate carrier drive system 60 (see FIG. 6) for driving substrate carrier 40 will be described. In the present embodiment, main controller 50 (see FIG. 6) drives substrate carrier 40 with a long stroke relative to noncontact holder 32 in the Y-axis direction and also finely drives substrate carrier 40 in the directions of three degrees of freedom within the horizontal plane, via substrate carrier drive system 60. Further, main controller 50 drives noncontact holder 32 and substrate carrier 40 integrally (synchronously) in the X-axis direction via substrate table drive system 56 described above (see FIG. 6) and substrate carrier drive system 60.

Figure 4:
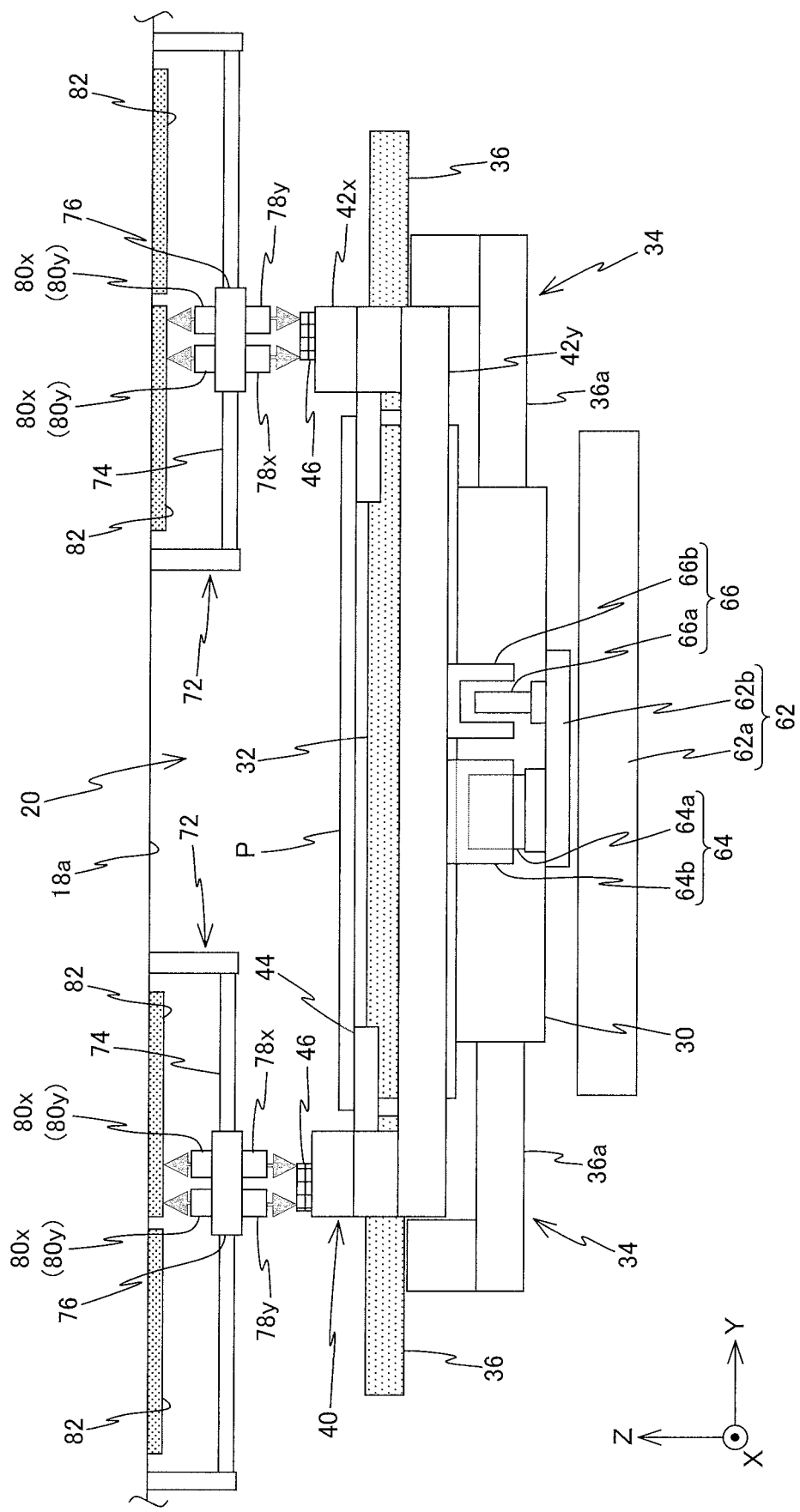
FIG. 4 is a required part enlarged view of the substrate stage device.

As illustrated in FIG. 2, substrate carrier drive system 60 is equipped with a pair of Y linear actuators 62 that include Y stators 62a that coarse movement stage 24 described above has and Y movers 62b that work with Y stators 62a to generate thrust forces in the Y-axis direction. As illustrated in FIG. 4, a Y stator 64a and an X stator 66a are attached to Y mover 62b of each of the pair of Y linear actuators 62.

Y stator 64a works with a Y mover 64b attached to substrate carrier 40 (the lower surface of Y frame 42y), to configure a Y voice coil motor 64 that applies a thrust force in the Y-axis direction to substrate carrier 40. Further, X stator 66a works with an X mover 66b attached to substrate carrier 40 (the lower surface of Y frame 42y), to configure an X voice coil motor 66 that applies a thrust force in the X-axis direction to substrate carrier 40. In this manner, substrate stage device 20 has one each of Y voice coil motor 64 and X voice coil motor 66 on each of the +X side and the −X side of substrate carrier 40.

Here, on the +X side and the −X side of substrate carrier 40, Y voice coil motors 64 and X voice coil motors 66 are each disposed point-symmetric with respect to the gravity center position of substrate P. Consequently, when causing the thrust force in the X-axis direction to act on substrate carrier 40 using X voice coil motor 66 on the −X side of substrate carrier 40 and X voice coil motor 66 on the +X side of substrate carrier 40, the effect similar to that of causing the thrust force in parallel to the X-axis direction to act on the gravity center position of substrate P can be obtained, that is, the moment in the θz direction can be suppressed from acting on substrate carrier 40 (substrate P). Note that since the pair of Y voice coil motors 64 are disposed with the gravity center (line) of substrate P in the X-axis direction in between, the moment in the θz direction does not act on substrate carrier 40.

Substrate carrier 40 is finely driven relative to coarse movement stage 24 (i.e. noncontact holder 32) in the directions of three degrees of freedom within the horizontal plane, by main controller 50 (FIG. 6) via the pair of Y voice coil motors 64 and the pair of X voice coil motors 66 described above. Further, when coarse movement stage 24 (i.e. noncontact holder 32) is moved with a long stroke in the X-axis direction, main controller 50 applies the thrust force in the X-axis direction to substrate carrier 40 using the pair of X voice coil motors 66 described above so that noncontact holder 32 and substrate carrier 40 are integrally moved with a long stroke in the X-axis direction.

Further, main controller 50 (see FIG. 6) relatively moves substrate carrier 40 with a long stroke with respect to noncontact holder 32 in the Y-axis direction, using the pair of Y linear actuators 62 and the pair of Y voice coil motors 64 described above. More specifically, while moving Y movers 62b of the pair of Y linear actuators 62 in the Y-axis direction, main controller 50 causes the thrust force in the Y-axis direction to act on substrate carrier 40 using Y voice coil motors 64 including Y stators 64a attached to Y movers 62b. Accordingly, substrate carrier 40 is moved with a long stroke in the Y-axis direction, independently (separately) from noncontact holder 32.

In this manner, in substrate stage device 20 of the present embodiment, substrate carrier 40 that holds substrate P is moved with a long stroke integrally with noncontact holder 32 in the X-axis (scanning) direction, whereas substrate carrier 40 is moved with a long stroke independently from noncontact holder 32 in the Y-axis direction. Note that, although the Z-positions of adsorption pads 44 and the Z-position of noncontact holder 32 are partially overlap as can be seen from FIG. 2, there is no risk that adsorption pads 44 and noncontact holder 32 come into contact with each other because it is only the Y-axis direction in which substrate carrier 40 is relatively moved with a long stroke with respect to noncontact holder 32.

Further, in the case of driving substrate table 30 (i.e. noncontact holder 32) in the Z-tilt directions, substrate P whose flatness has been corrected along noncontact holder 32 changes in attitude together with noncontact holder 32 in the Z-tilt directions, and therefore substrate carrier 40 that adsorbs and holds substrate P changes in attitude together with substrate P in the Z-tilt directions. Note that the attitude of substrate carrier 40 may be prevented from changing, by the elastic deformation of adsorption pads 44.

Referring back to FIG. 1, the pair of auxiliary tables 34 are devices that work with noncontact holder 32 to support the lower surface of substrate P held by substrate carrier 40, when substrate carrier 40 is relatively moved in the Y-axis direction separately from noncontact holder 32. As is described above, substrate carrier 40 is relatively moved with respect to noncontact holder 32 in a state of holding substrate P, and therefore, for example, when substrate carrier 40 is moved in the +Y direction from the state illustrated in FIG. 1, the +Y side end vicinity part of substrate P is no longer supported by noncontact holder 32. Therefore, in substrate stage device 20, in order to suppress the bending due to the self-weight of a portion, of substrate P, that is not supported by noncontact holder 32, substrate P is supported from below using one of the pair of auxiliary tables 34. The pair of auxiliary tables 34 have substantially the same structure, except that they are disposed laterally symmetric on the page surface.

As illustrated in FIG. 3, auxiliary table 34 has a plurality of air levitation units 36. Note that such a configuration is employed in the present embodiment that air levitation unit 36 is formed into a bar-like shape extending in the Y-axis direction, and the plurality of air levitation units 36 are disposed at a predetermined spacing in the X-axis direction. However, the shape, the number, the arrangement and the like of air levitation units 36 are not limited in particular, as far as the bending of substrate P due to the self-weight can be suppressed. As illustrated in FIG. 4, the plurality of air levitation units 36 are supported from below by arm-like support members 36a protruding from the side surfaces of substrate table 30. A minute gap is formed between the plurality of air levitation units 36 and noncontact holder 32.

The height positions of the upper surfaces of air levitation units 36 are set substantially the same as (or slightly lower than) the height position of the upper surface of noncontact holder 32. Air levitation units 36 support substrate P in a noncontact manner by blowing out gas (e.g. air) from the upper surface of air levitation units 36 to the lower surface of substrate P. Note that, although noncontact holder 32 described above performs the flatness correction of substrate P by causing the preload to act on substrate P, air levitation units 36 only have to suppress the bending of substrate P, and therefore air levitation units 36 may only supply the gas to the lower surface of substrate P and do not have to control in particular the height position of substrate P on air levitation units 36.

Next, a substrate position measurement system for measuring position information of substrate P in the directions of six degrees of freedom will be described. The substrate position measurement system includes: a Z-tilt position measurement system 58 (see FIG. 6) for obtaining position information of substrate table 30 in a direction intersecting the horizontal plane (the position information in the Z-axis direction, and rotation amount information in the θx direction and the θy direction, which are hereinafter referred to as "Z-tilt position information"); and an horizontal-in-plane position measurement system 70 (see FIG. 6) for obtaining position information of substrate carrier 40 within the XY plane (the position information in X-axis direction and the Y-axis direction, and rotation amount information in the θz direction).

Figure 6:
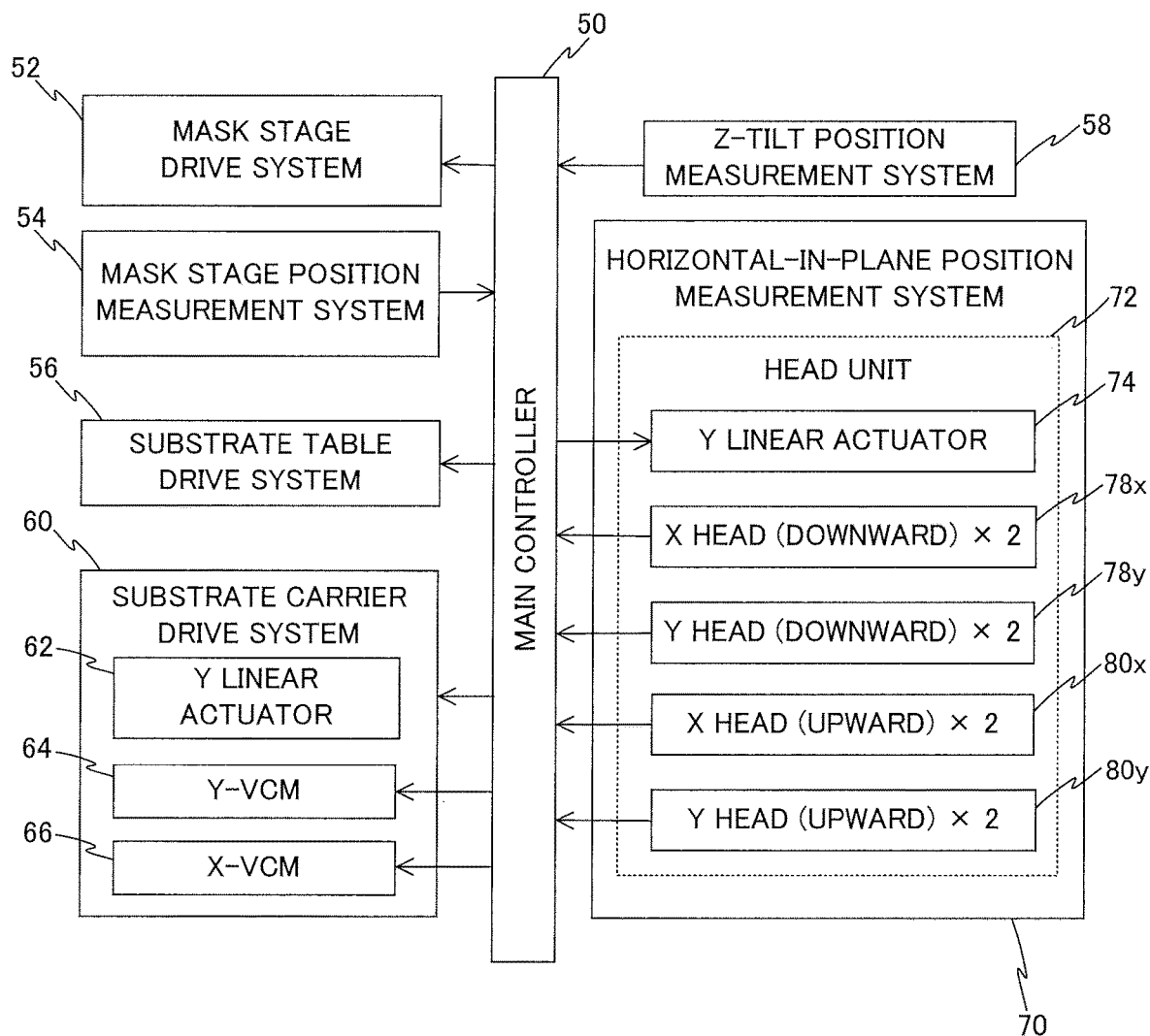
FIG. 6 is a block diagram showing the input/output relationship of a main controller that centrally configures a control system of the liquid crystal exposure apparatus.

As illustrated in FIG. 2, Z-tilt position measurement system 58 includes a plurality (at least three) of laser displacement meters 58a fixed to the lower surface of substrate table 30 on the periphery of spherical bearing device 26c. Laser displacement meter 58a irradiates a target 58b fixed to a housing of weight canceling device 26 with a measurement beam and receives the reflected beam, thereby supplying displacement amount information of substrate table 30 in the Z-axis direction at the irradiation point of the measurement beam to main controller (FIG. 6). For example, the at least three laser displacement meters 58a are disposed at three locations that do not lie on the same straight line (e.g. the positions corresponding to the apexes of an equilateral triangle), and main controller 50 obtains the Z-tilt position information of substrate table 30 (i.e. substrate P) on the basis of the outputs of the at least three laser displacement meters 58a. Since weight cancelling device 26 is moved along the upper surface of X guide bar 28 (the horizontal plane), main controller 50 can measure the attitude change of substrate table 30 with respect to the horizontal plane irrespective of the X-position of substrate table 30.

Horizontal-in-plane position measurement system 70 (see FIG. 6) has a pair of head units 72, as illustrated in FIG. 1. One head unit 72 is disposed on the −Y side of projection optical system 16, while the other head unit 72 is disposed on the +Y side of projection optical system 16.

Each of the pair of head units 72 obtains position information of substrate P within the horizontal plane, using reflection-type diffraction gratings that substrate carrier 40 has. Corresponding to the pair of head units 72, a plurality (e.g. six in FIG. 3) of scale plates 46 are pasted on the upper surface of each of the pair of X frames 42x of substrate carrier 40, as illustrated in FIG. 3. Scale plate 46 is made up of a member with a band-like shape in planar view extending in the X-axis direction. The length of scale plate 46 in the X-axis direction is shorter than the length of X frame 42x in the X-axis direction, and the plurality of scale plates 46 are arrayed at a predetermined spacing (spaced apart from each other) in the X-axis direction.

Figure 5:
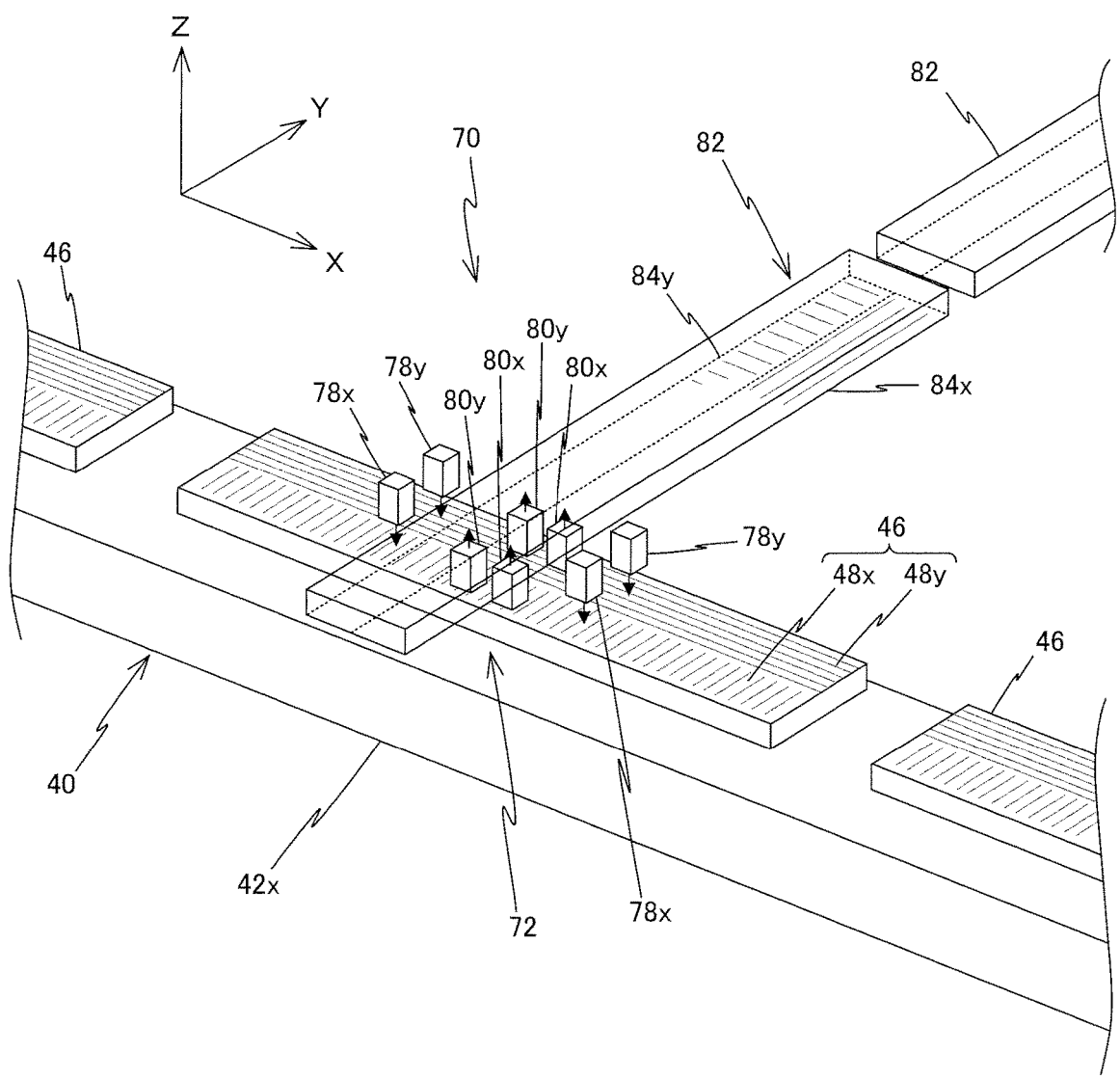
FIG. 5 is a concept view of a substrate position measurement system equipped in the liquid crystal exposure apparatus shown in FIG. 1.

FIG. 5 shows X frame 42x on the −Y side and head unit 72 corresponding thereto. On each of the plurality of scale plates 46 fixed on X frame 42x, an X scale 48x and a Y scale 48y are formed. X scale 48x is formed in the −Y side half area of scale plate 46, while Y scale 48y is formed in the +Y side half area of scale plate 46. X scale 48x has a reflection-type X diffraction grating, and Y scale 48y has a reflection-type Y diffraction grating. Note that in FIG. 5, in order to facilitate the understanding, a spacing (a pitch) between a plurality of grid lines that form X scale 48x and Y scale 48y is illustrated wider than the actual spacing (the actual pitch).

As illustrated in FIG. 4, head unit 72 is equipped with: a Y linear actuator 74; a Y slider 76 that is driven with a predetermined stroke relative to projection optical system 16 (see FIG. 1) in the Y-axis direction, by Y linear actuator 74; and a plurality of measurement heads (X encoder heads 78x and 80x and Y encoder heads 78y and 80y) that are fixed to Y slider 76. The pair of head units 72 are similarly configured except that they are configured laterally symmetric on the page surface in FIGS. 1 and 4. Further, the plurality of scale plates 46 fixed on each of the pair of X frames 42x are also configured laterally symmetric in FIGS. 1 and 4.

Y linear actuator 74 is fixed to the lower surface of upper mount section 18a that apparatus main body 18 has. Y linear actuator 74 is equipped with a linear guide that straightly guides Y slider 76 in the Y-axis direction, and a drive system that applies a thrust force to Y slider 76. The type of the linear guide is not particularly limited, but an air bearing with a high repetitive reproducibility is suitable. Further, the type of the drive system is not particularly limited, and a linear motor, a belt (or wire) drive device or the like can be used.

Y linear actuator 74 is controlled by main controller 50 (see FIG. 6). The stroke amount of Y slider 76 in the Y-axis direction by Y linear actuator 74 is set equivalent to the stroke amount of substrate P (substrate carrier 40) in the Y-axis direction.

As illustrated in FIG. 5, head unit 72 is equipped with a pair of X encoder heads 78x (hereinafter, referred to as "X heads 78x") and a pair of Y encoder heads 78y (hereinafter, referred to as "Y heads 78y"). The pair of X heads 78x and the pair of Y heads 78y are each disposed at a predetermined spacing in the X-axis direction.

X heads 78x and Y heads 78y are encoder heads of a so-called diffraction interference method as disclosed in, for example, U.S. Patent Application Publication No. 2008/0094592, and irradiate the respective corresponding scales (X scale 48x and Y scale 48y) with measurement beams downwardly (in the −Z direction), and receive beams (returned beams) from the respective scales, thereby supplying displacement amount information of substrate carrier 40 to main controller 50 (see FIG. 6).

That is, in horizontal-in-plane position measurement system 70 (see FIG. 6), for example, four X heads 78x in total that the pair of heads units 72 have and X scales 48x that face these X heads 78x configure, for example, four X linear encoder systems for obtaining position information of substrate carrier 40 in the X-axis direction. Similarly, for example, four Y heads 78y in total that the pair of heads units 72 have and Y scales 48y that face these Y heads 78y configure, for example, four Y linear encoder systems for obtaining position information of substrate carrier 40 in the Y-axis direction.

Here, the spacing between the pair of X heads 78x and the spacing between the pair of Y heads 78y in the X-axis direction that head unit 72 has is set wider than the spacing between scale plates 46 adjacent to each other. Accordingly, in the X encoder systems and the Y encoder systems, at least one of the pair of X heads 78x constantly faces X scale 48x and also at least one of the pair of Y heads 78y constantly faces Y scale 48y, irrespective of the position of substrate carrier 40 in the X-axis direction.

Specifically, main controller 50 (FIG. 6) obtains X-position information of substrate carrier 40 on the basis of the average value of the outputs of the pair of X heads 78x in a state where the pair X heads 78x both face X scale 48x. Further, main controller 50 obtains the X-position information of substrate carrier 40 on the basis of only the output of one X head 78x of the pair of X heads 78x in a state where only the one X head 78x faces X scale 48x. Consequently, the X encoder systems can supply the position information of substrate carrier 40 to main controller 50 without interruption. The same can be said for the Y encoder systems.

Here, since substrate carrier 40 of the present embodiment can be moved with a predetermined long stroke also in the Y-axis direction as is described above, main controller 50 (see FIG. 6) drives Y slider 76 (see FIG. 4) of each of the pair of head units 72 in the Y-axis direction, via Y linear actuator 74 (see FIG. 4), to follow substrate carrier 40, depending on the position of substrate carrier 40 in the Y-axis direction, so that respective facing states between X heads 78x and Y heads 78y and scales 48x and 48y respectively corresponding thereto are maintained. Main controller 50 comprehensively obtains position information of substrate carrier 40 within the horizontal plane, by using together the displacement amount (the position information) of Y sliders 76 (i.e. each of heads 78x and 78y) in the Y-axis direction and the output from each of heads 78x and 78y.

The position (displacement amount) information of Y sliders 76 (see FIG. 4) within the horizontal plane is obtained by encoder systems with the measurement accuracy equivalent to that of the encoder systems using X heads 78x and Y heads 78y described above. As can be seen from FIGS. 4 and 5, Y slider 76 has a pair of X encoder heads 80x (hereinafter, referred to as "X heads 80x") and a pair of Y encoder heads 80y (hereinafter, referred to as "Y heads 80y"). The pair of X heads 80x and the pair of Y heads 80y are each disposed at predetermined spacing in the Y-axis direction.

Main controller 50 (see FIG. 6) obtains position information of Y sliders 76 within the horizontal plane using a plurality of scale plates 82 fixed to the lower surface of upper mount section 18a of apparatus main body 18 (see FIG. 1 for each of them). Scale plate 82 is made up of a member with a band-like shape in planar view extending in the Y-axis direction. In the present embodiment, for example, two scale plates 82 are disposed at a predetermined spacing (spaced apart from each other) in the Y-axis direction, above each of the pair of head units 72.

As illustrated in FIG. 5, in a +X side area on the lower surface of scale plate 82, an X scale 84x is formed facing the pair of X heads 80x described above, and in a −X side area on the lower surface of scale plate 82, a Y scale 84y is formed facing the pair of Y heads 80y described above. X scale 84x and Y scale 84y are light-reflection-type diffraction gratings having configurations substantially similar to those of X scale 48x and Y scale 48y formed on scale plate 46 described above. Further, X head 80x and Y head 80y are encoder heads of a diffraction interference method having configurations similar to those of X head 78x and Y head 78y (the downward heads) described above.

The pair of X heads 80x and the pair of Y heads 80y irradiate the respective corresponding scales (X scale 84x and Y scale 84y) with measurement beams upwardly (in the +Z direction), and receive the beams from the respective scales, thereby supplying displacement amount information of Y slider 76 (see FIG. 4) within the horizontal plane to main controller 50 (see FIG. 6). The spacing in the Y-axis direction between the pair of X heads 80x and the spacing in the Y-axis direction between the pair of Y heads 80y are each set wider than the spacing between scale plates 82 adjacent to each other. Accordingly, at least one of the pair of X heads 80x constantly faces X scale 84x and also at least one of the pair of Y heads 80y constantly faces Y scale 84y, irrespective of the position of Y slider 76 in the Y-axis direction. Consequently, the position information of Y slider 76 can be supplied to main controller 50 (see FIG. 6) without interruption.

In FIG. 6, a block diagram is illustrated that shows the input/output relationship of main controller 50 that centrally configures the control system of liquid crystal exposure apparatus 10 (see FIG. 1) and performs the overall control of the respective constituents. Main controller 50 includes a workstation (or a microcomputer) and the like, and performs the overall control of the respective constituents of liquid crystal exposure apparatus 10.

In liquid crystal exposure apparatus 10 (see FIG. 1) configured as described above, under the control of main controller 50 (see FIG. 6), mask M is loaded onto mask stage 14 by a mask loader (not illustrated) and also substrate P is loaded onto substrate stage device 20 (substrate carrier 40 and noncontact holder 32) by a substrate loader (not illustrated). After that, main controller 50 implements alignment measurement using an alignment detection system (not illustrated), and focus mapping using an autofocus sensor (not illustrated) (a surface position measurement system of substrate P), and after the alignment measurement and the focus mapping are finished, the exposure operations of a step-and-scan method are sequentially performed with respect to a plurality of shot areas set on substrate P.

Next, an example of operations of substrate stage device 20 at the time of exposure operations will be described using FIGS. 7a to 9b. Note that although in the description below, the case when four shot areas are set on one substrate P (this is what is called the case of preparing four areas) will be described, the number and the arrangement of the shot areas set on one substrate P can be changed as needed. Further, in the present embodiment, as an example, the description will be made assuming that the exposure processing is performed from a first shot area S1 set on the −Y side and on the +X side of substrate P. Further, in order to avoid the intricacy of the drawings, a part of elements that substrate stage device 20 has is omitted in FIGS. 7a to 9b.

Figure 7A:
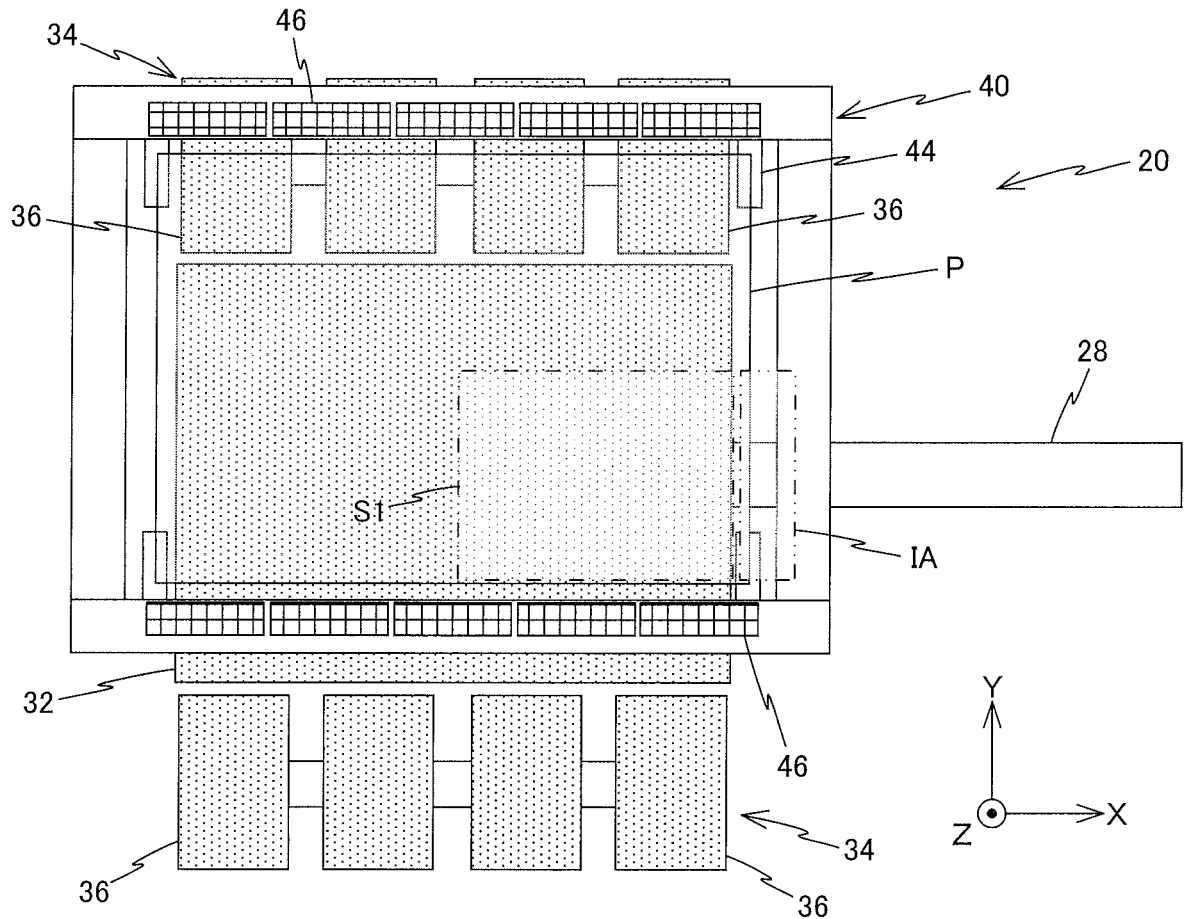
FIGS. 7a and 7b are views (a plan view and a front view, respectively) to explain an operation (No. 1) of the substrate stage device at the time of exposure operations.
Figure 7B:
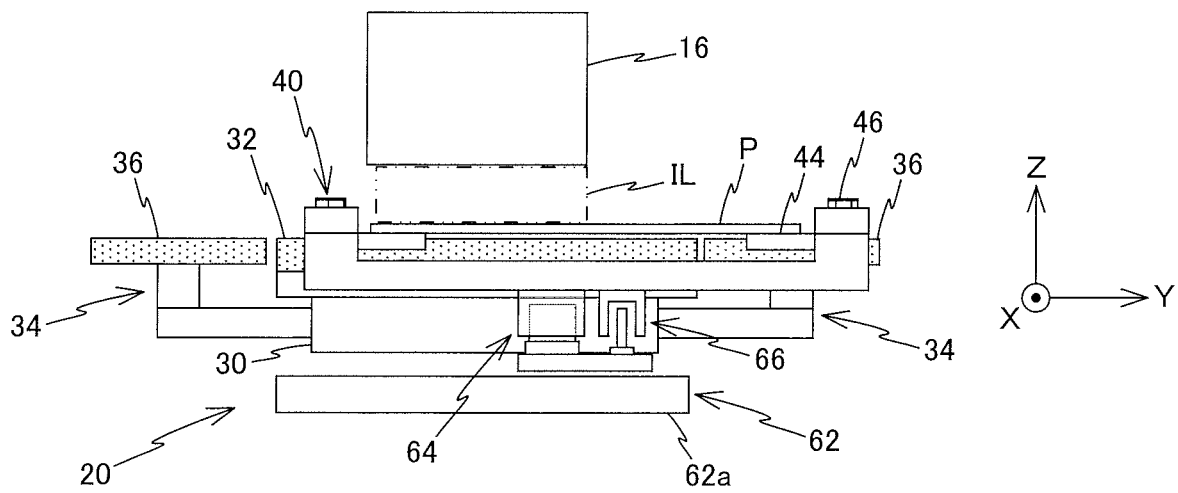

FIGS. 7a and 7b show a plan view and a front view, respectively, of substrate stage device 20 in a state where operations such as an alignment operation have been completed and preparation of the exposure operation with respect to the first shot area 51 is finished. In substrate stage device 20, as illustrated in FIG. 7a, the positioning of substrate P is performed on the basis of the output of horizontal-in-plane position measurement system 70 (see FIG. 6) so that the +X side end of the first shot area 51 is slightly on the further −X side than exposure area IA formed on substrate P by illumination light IL from projection optical system 16 (see FIG. 7b for each of them) being irradiated (however, in the state illustrated in FIG. 7a, illumination light IL has not yet been irradiated on substrate P).

Further, since the center of exposure area IA and the center of X guide bar 28 (i.e. noncontact holder 32) substantially coincide with each other in the Y-axis direction, the +Y side end vicinity part of substrate P held by substrate carrier 40 protrudes from noncontact holder 32. The protruding portion of substrate P is supported from below by auxiliary table 34 disposed on the +Y side of noncontact holder 32. At this time, although the flatness correction by noncontact holder 32 is not performed with respect to the +Y side end vicinity part of substrate P, the exposure accuracy is not affected because the flatness corrected state is maintained for an area including the first shot area 51 serving as an exposure target.

Figure 8A:
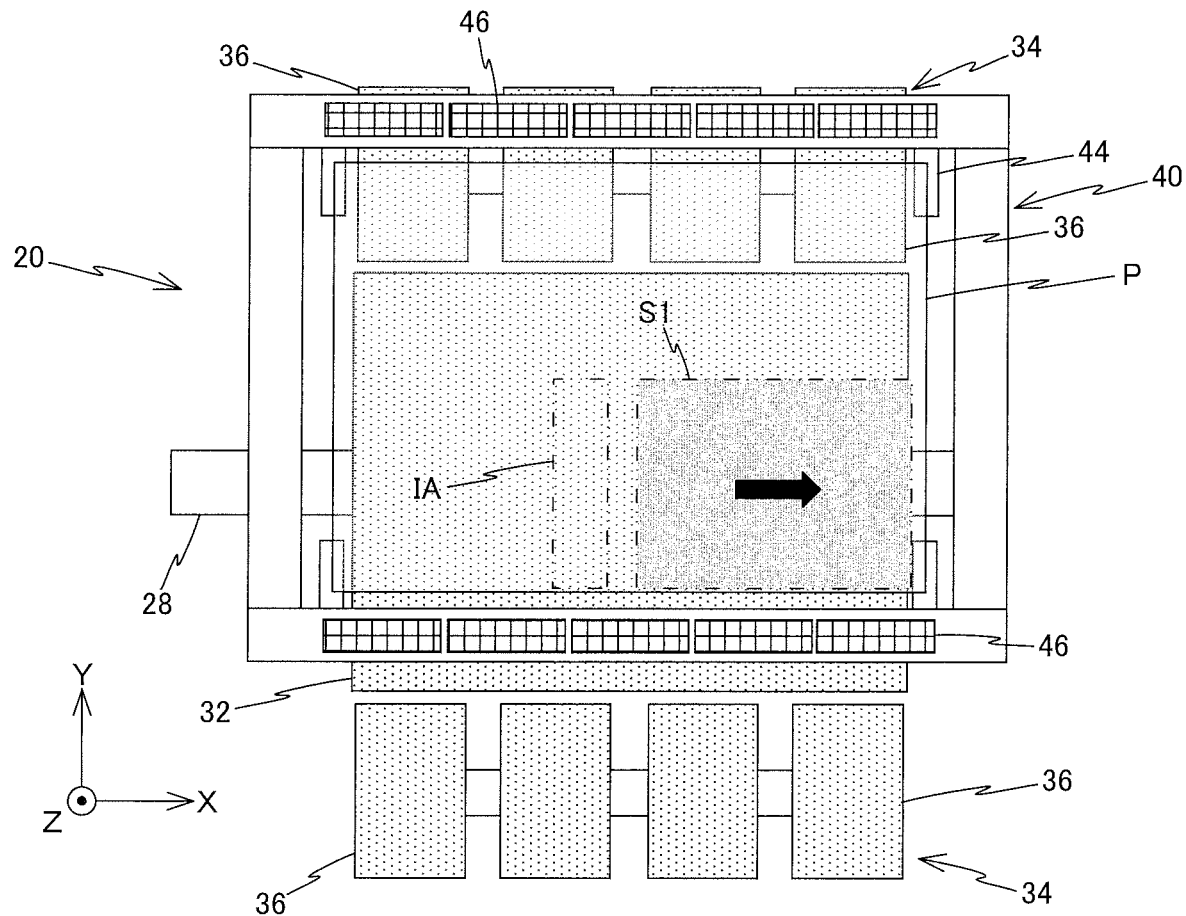
FIGS. 8a and 8b are views (a plan view and a front view, respectively) to explain an operation (No. 2) of the substrate stage device at the time of exposure operations.
Figure 8B:
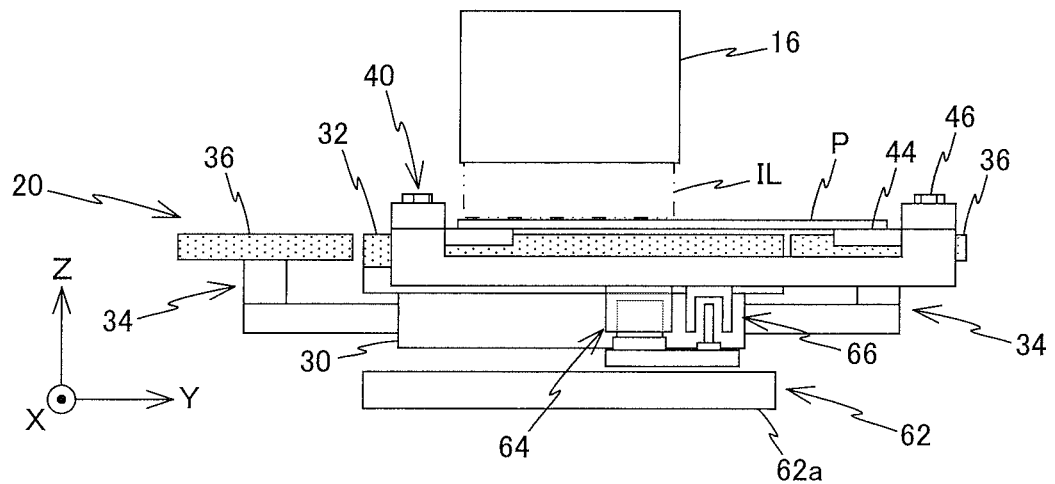

Subsequently, from the state illustrated in FIGS. 7a and 7b, substrate carrier 40 and noncontact holder 32 are integrally (synchronously) driven (accelerated, driven at the constant speed, and decelerated) in the +X direction on X guide bar 28 (see a black arrow in FIG. 8a), synchronously with mask M (see FIG. 1), on the basis of the output of horizontal-in-plane position measurement system 70 (see FIG. 6), as illustrated in FIGS. 8a and 8b. While substrate carrier 40 and noncontact holder 32 are driven at the constant speed in the X-axis direction, substrate P is irradiated with illumination light IL that has passed through mask M (see FIG. 1) and projection optical system 16 (see FIG. 8b for each of illumination light IL and projection optical system 16), and thereby a mask pattern that mask M has is transferred onto the shot area 51. At this time, substrate carrier 40 is finely driven as needed relative to noncontact holder 32 in the directions of three degrees of freedom within the horizontal plane, in accordance with the result of the alignment measurement, and noncontact holder 32 is finely driven as needed in the Z-tilt directions in accordance with the result of the focus mapping described above.

Here, in horizontal-in-plane position measurement system 70 (see FIG. 6), when substrate carrier 40 and noncontact holder 32 are driven in the X-axis direction (the +X direction in FIG. 8a), Y sliders 76 that the pair of head units 72 respectively have are in a static state (however, head units 72 need not exactly be static, and at least a part of the heads that head units 72 have only have to face scale plates 46 in the Y-axis direction).

Figure 9A:
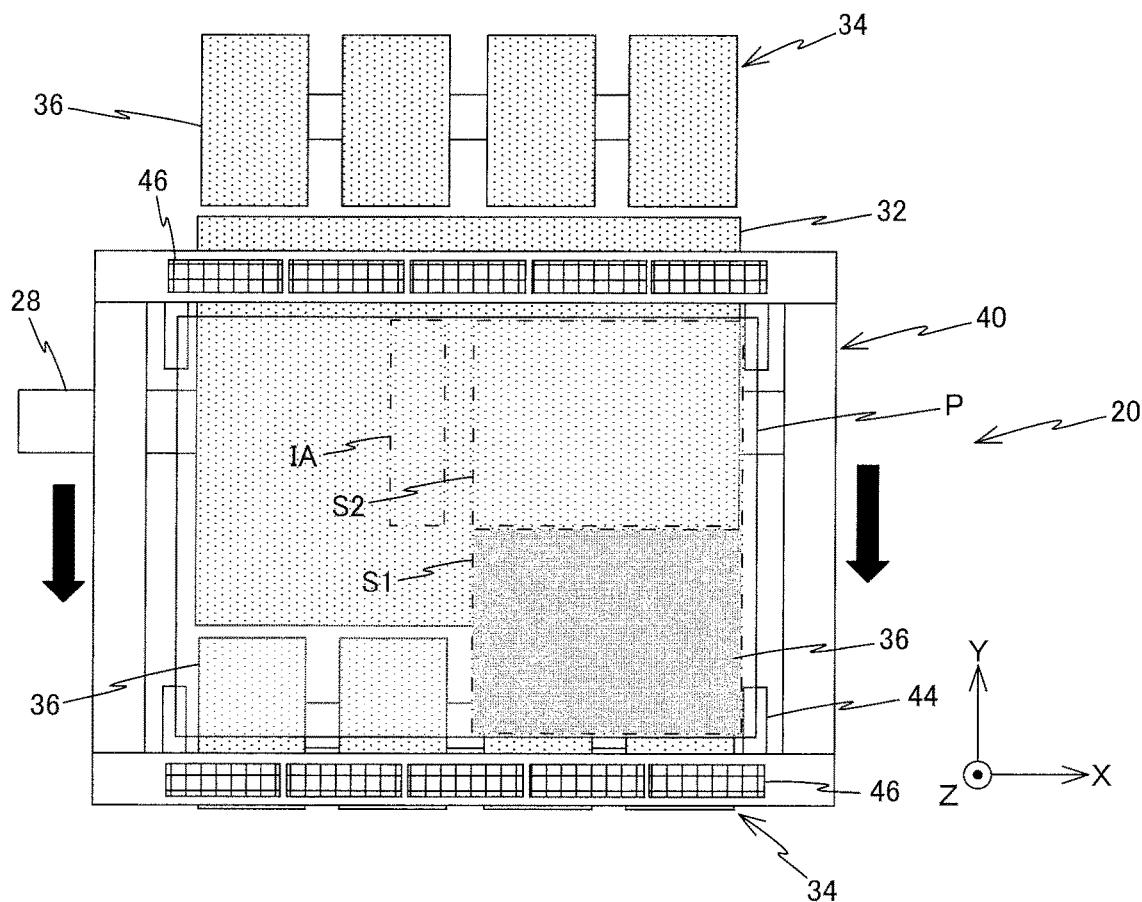
FIGS. 9a and 9b are views (a plan view and a front view, respectively) to explain an operation (No. 3) of the substrate stage device at the time of exposure operations.
Figure 9B:
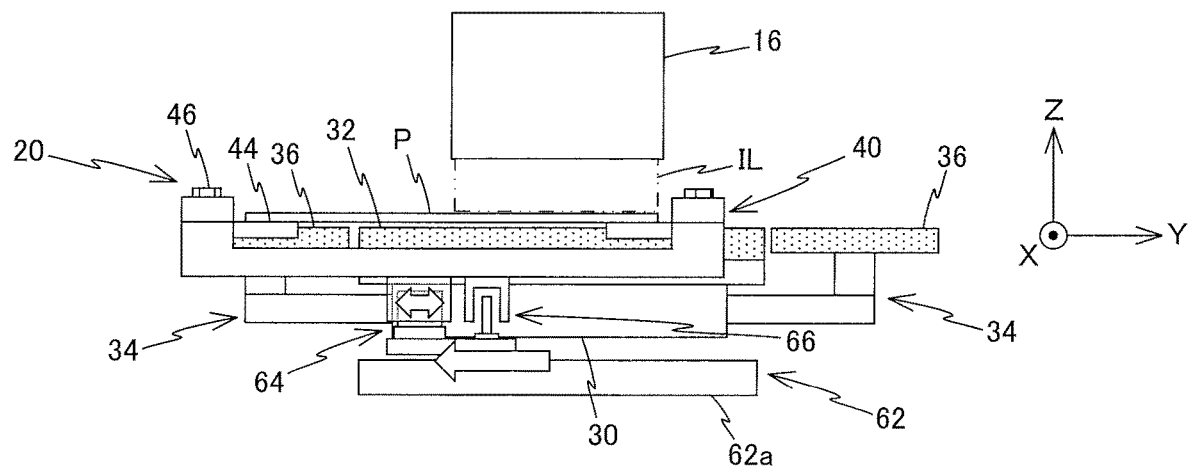

When the transfer of the mask pattern on the first shot area S1 on substrate P has been completed, in substrate stage device 20, as illustrated in FIGS. 9a and 9b, for the exposure operation with respect to a second shot area S2 set on the +Y side of the first shot area S1, substrate carrier 40 is driven (Y-step driven) by a predetermined distance in the −Y direction (a distance that is substantially a half of the width direction size of substrate P) (see black arrows in FIG. 9a), on the basis of the output of horizontal-in-plane position measurement system 70 (see FIG. 6). By the foregoing Y-step operation of substrate carrier 40, the −Y side end vicinity part of substrate P held by substrate carrier 40 is supported from below by auxiliary table 34 disposed on the −Y side of noncontact holder 32.

Further, in horizontal-in-plane position measurement system 70 (see FIG. 6), when substrate carrier 40 described above is driven in the Y-axis direction, Y sliders 76 that the pair of head units 72 respectively have (see FIG. 4 for each of them) are driven synchronously with substrate carrier 40 (however, their speeds do not exactly have to coincide with each other) in the Y-axis direction.

Then, although not illustrated, substrate carrier 40 and noncontact holder 32 are driven in the −X direction, synchronously with mask M (see FIG. 1), and thereby the scanning exposure with respect to the second shot area S2 is performed. Further, the Y-step operation of substrate carrier 40 and the constant speed movement of substrate carrier and noncontact holder 32 in the X-axis direction in synchronization with mask M are repeated as needed, and thereby the scanning exposure operations with respect to all the shot areas set on substrate P are sequentially performed.

According to substrate stage device 20 described so far that liquid crystal exposure apparatus 10 related to the present first embodiment has, when the high accuracy positioning of substrate P within the XY plane is performed, substrate carrier 40 with a frame-like shape that holds only the outer periphery edge of substrate P is driven in the directions of three degrees of freedom within the horizontal plane. Therefore, an object to be driven (substrate carrier 40 in the present embodiment) is lightweight, compared with, for example, the case of performing the high accuracy positioning of substrate P by driving a substrate holder that adsorbs and holds the entire lower surface of substrate P in the directions of three degrees of freedom within the horizontal plane, and thus the position controllability is improved. Further, the actuators for driving (Y voice coil motors 64 and X voice coil motors 66 in the present embodiment) can be downsized.

Further, since horizontal-in-plane position measurement system 70 for obtaining position information of substrate P within the XY plane includes the encoder systems, the influence by air fluctuation can be reduced, compared with, for example, conventional interferometer systems. Consequently, the positioning accuracy of substrate P is improved. Further, since the influence by air fluctuation is small, a partial air-conditioning facility that is essential in the case of using the conventional interferometer systems can be omitted, which allows the cost to be reduced.

Figure 10A:
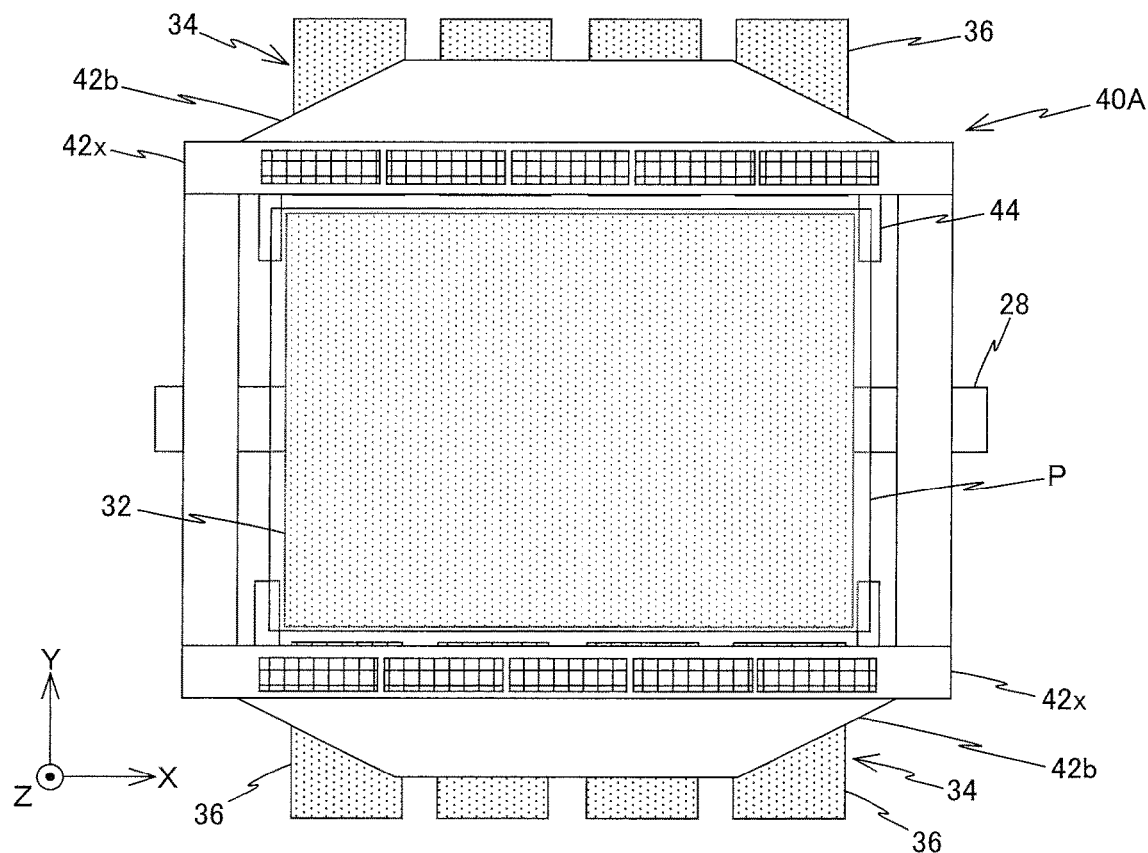
FIGS. 10a and 10b are views (a plan view and a front view, respectively) showing a substrate carrier related to a first modified example of the first embodiment.
Figure 10B:
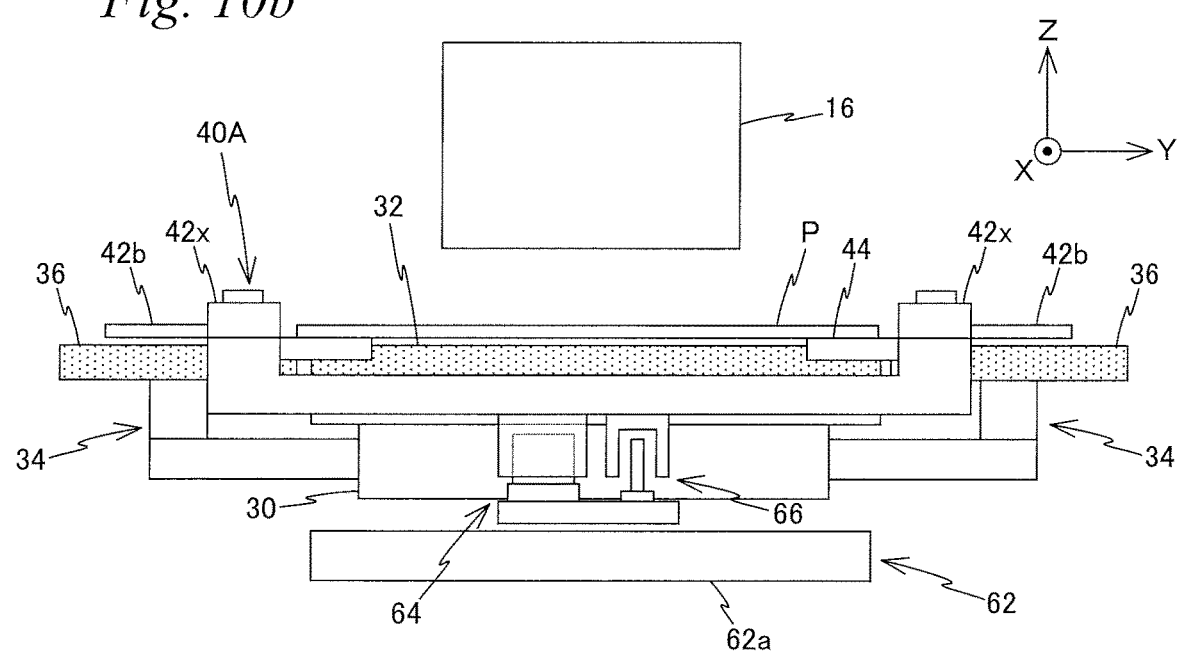

Note that the configuration described in the present first embodiment is an example, and can be modified as needed. For example, in a substrate carrier 40A related to a first modified example illustrated in FIGS. 10a and 10b, a plate member 42b that is auxiliary is coupled to the outer side surface of each of the pair of X frames 42x. Plate member 42b is disposed substantially parallel to the XY plane and the lower surface of plate member 42b faces the upper surface of air levitation unit 36 via a predetermined spacing, as illustrated in FIG. 10b. The plurality of air levitation units 36 blowout the gas to the lower surface of plate member 42b, thereby causing a force (a lift force) in the +Z direction (an upward direction in the gravity direction) to act on substrate carrier 40A. Since substrate carrier 40A related to the present first modified example is constantly supported from below by the plurality of air levitation units 36, it is possible to prevent X frames 42x and noncontact holder 32 (or air levitation units 36) from coming into contact with each other when substrate carrier 40A is relatively moved with respect to noncontact holder 32 in the Y-axis direction, even if the difference in level (the difference in the height position in the Z-axis direction) is formed between noncontact holder 32 and the plurality of air levitation units 36.

Figure 11:
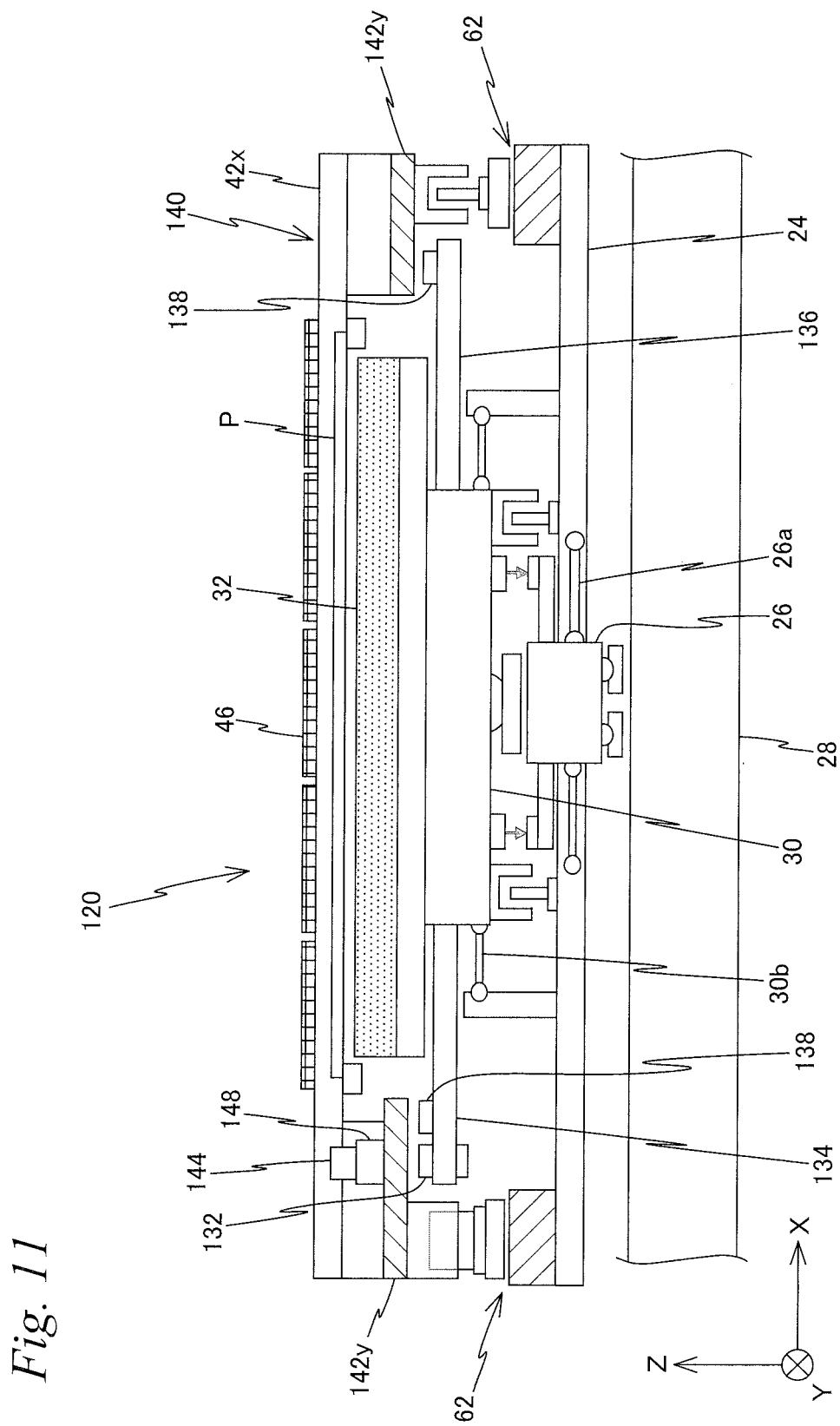
FIG. 11 is a view showing a substrate stage device related to a second modified example of the first embodiment.
Figure 12A:
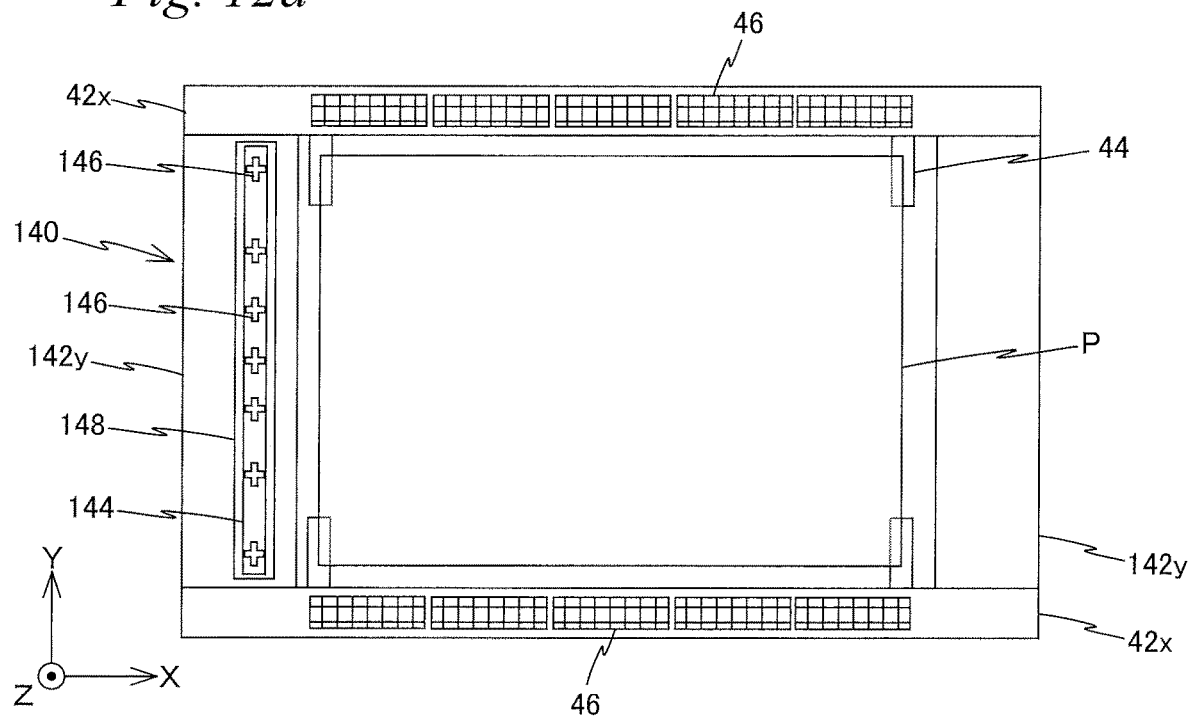
FIG. 12a is a plan view of a substrate carrier related to the second modified example.
Figure 12B:
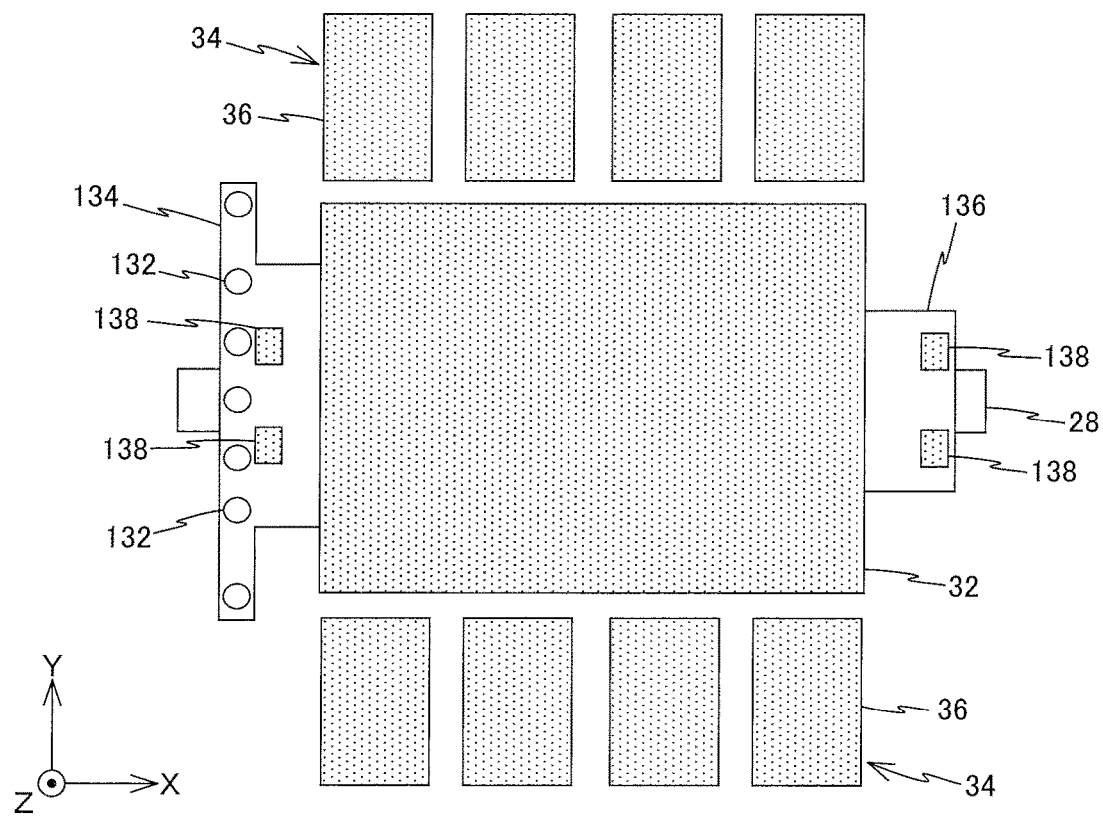
FIG. 12b is a plan view of a substrate table related to the second modified example.

Further, for example, like a substrate stage device 120 related to a second modified example illustrated in FIG. 11, a reference index plate 144 may be attached to a substrate carrier 140 and mark measurement sensors 132 may be attached to substrate table 30. As illustrated in FIG. 12a, a plurality of reference marks 146 are formed at reference index plate 144, spaced from each other in the Y-axis direction. Reference index plate 144 is fixed, via a raising member 148, to the upper surface of a Y frame 142y on the -X side of substrate carrier 140 so that the Z-positions of the plurality of reference marks 146 are substantially the same as the Z-position of the surface of substrate P (see FIG. 11). Referring back to FIG. 11, the plurality of mark measurement sensors 132 are attached to a tabular member 134 with a T-like shape in planar view (see FIG. 12b) that is formed protruding from the -X side surface of substrate table 30. As illustrated in FIG. 12b, the plurality of mark measurement sensors 132 are disposed, spaced apart from each other in the Y-axis direction, corresponding to the plurality of reference marks 146 described above (i.e. so that the plurality of mark measurement sensors 132 overlap the plurality of reference marks 146 in the vertical direction).

In the present second modified example, calibration related to, for example, the optical properties (such as, for example, scaling, shift and rotation) of projection optical system 16 (see FIG. 1) is performed using the plurality of reference marks 146 and the plurality of mark measurement sensors 132 corresponding thereto. The calibration method is substantially the same as a calibration method disclosed in, for example, Japanese Patent Application Publication No. 2006-330534, and therefore the description thereof will be omitted. In the present second modified example, since substrate table 30, which is mechanically separated from substrate carrier 140 having reference marks 146, has mark measurement sensors 132, the wiring and the like are not necessary for substrate carrier 140 itself, which allows the weight of substrate carrier 140 to be reduced.

Further, Y frame 142y of substrate carrier 140 related to the present second modified example is formed wider, compared to that of the first embodiment described above. Then, as illustrated in FIG. 12b, on each of the upper surface of tabular member 134 described above and the upper surface of a tabular member 136 formed protruding from the +X side surface of substrate table 30, for example, two air bearings 138 that are spaced apart in the Y-axis direction are attached. As illustrated in FIG. 11, for example, the two air bearings 138 on the +X side face the lower surface of Y frame 142y on the +X side of substrate carrier 140, and for example, the two air bearings 138 on the -X side face the lower surface of Y frame 142y on the -X side of substrate carrier 140. Air bearings 138 blowout the pressurized gas to the lower surface of the facing Y frames 142y, thereby supporting substrate carrier 140 in a noncontact manner via a predetermined gap. Accordingly, the bending of substrate carrier 140 is suppressed. Note that air bearings 138 may be attached to the substrate carrier 140 side to face the upper surfaces of tabular members 134 and 136 described above. Further, for example, substrate carrier 140 may be magnetically levitated using magnets, instead of air bearings 138, or a buoyancy force may be caused to act using actuators such as voice coil motors.

Figure 13A:
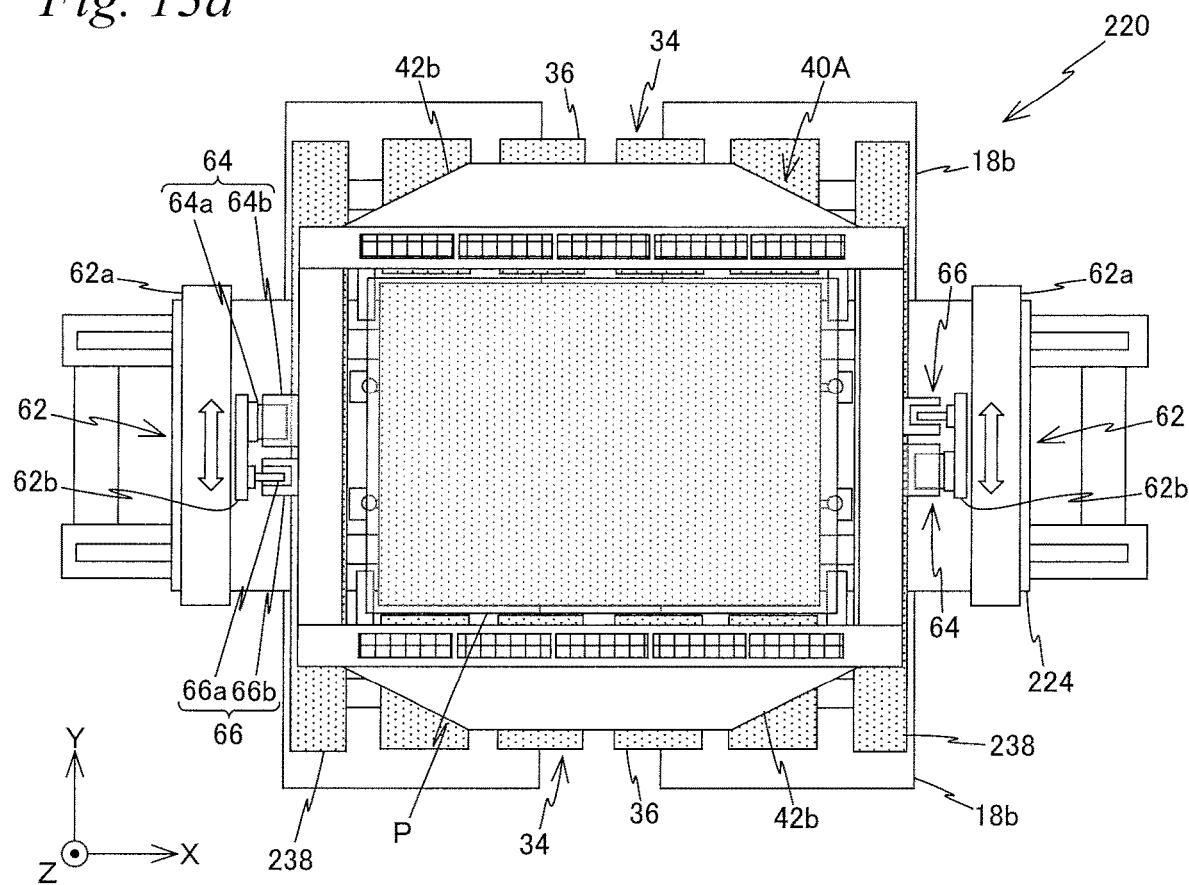
FIGS. 13a and 13b are views (a plan view and a cross-sectional view, respectively) showing a substrate stage device related to a third modified example of the first embodiment.
Figure 13B:
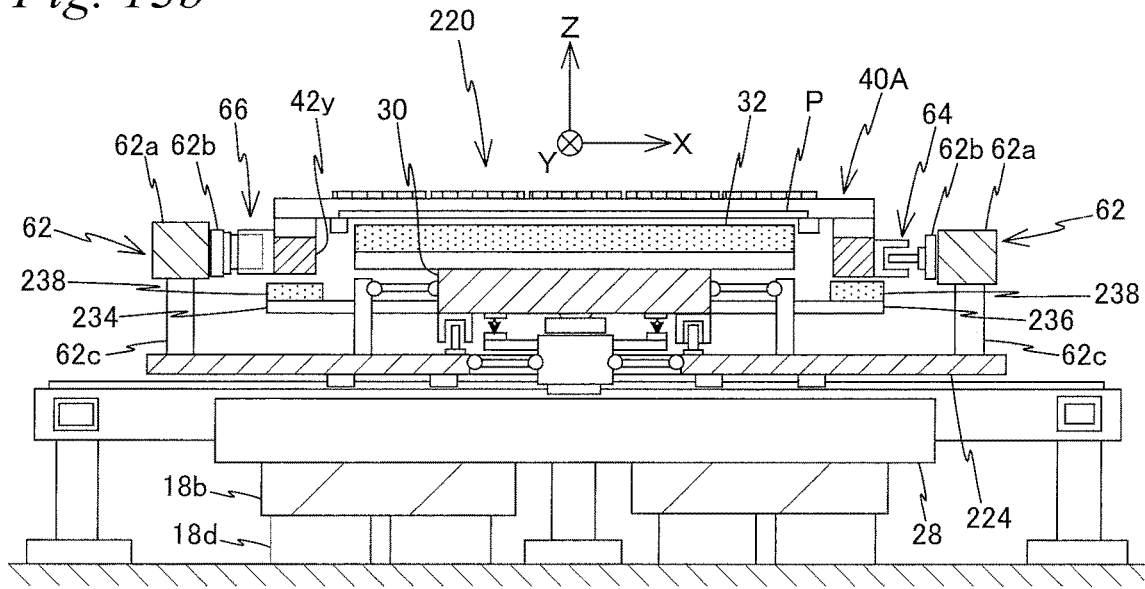

Further, like a substrate stage device 220 related to a third modified example as illustrated in FIGS. 13a and 13b, the Z-positions of Y linear actuators 62, Y voice coil motors 64 and X voice coil motors 66 may be set the same as the Z-position of substrate carrier 40A. That is, in substrate stage device 220, Y movers 64b of Y voice coil motors 64 and X movers 66b of X voice coil motors 66 are fixed to the side surfaces of Y frames 42y of substrate carrier 40A. Further, Y stators 62a of Y linear actuators 62 for driving in the Y-axis direction Y movers 62b, to which Y stators 64a of Y voice coil motors 64 and X stators 66a of X voice coil motors 66 are attached, are attached on a coarse movement stage 224 via support columns 62c, so that the Z-positions of Y stators 62a are the same as the Z-position of substrate carrier 40A.

Further, substrate carrier 40A of the present third modified example has a pair of plate members 42b being auxiliary that are supported from below by the plurality of air levitation units 36, which is similar to the first modified example described above (see FIGS. 10a and 10b). Further, As illustrated in FIG. 13b, tabular members 234 and 236 protrude from the -X side surface and the +X side surface, respectively, of substrate table 30, and air levitation units 238 each extending in the Y-axis direction are fixed on tabular members 234 and 236. The height position of the upper surfaces of air levitation units 238 are set lower, compared to the height positions of air levitation units 36. In substrate carrier 40A, Y frames 42y are constantly (irrespective of the position in the Y-axis direction) supported from below by air levitation units 238 in a noncontact manner. In other words, substrate carrier 40A is placed on a pair of air levitation units 238. Accordingly, the bending of substrate carrier 40A is suppressed.

Second Embodiment

Next, a liquid crystal exposure apparatus related to a second embodiment will be described using FIGS. 14 to 20b. Since the configuration of the liquid crystal exposure apparatus related to the second embodiment is the same as that in the first embodiment described above, except that the configuration of a substrate stage device 420 is different. Therefore, hereinafter only the differences will be described, and elements that have the same configurations and functions as those in the first embodiment described above will be provided with the same reference signs as those in the first embodiment described above, and the description thereof will be omitted.

In substrate stage device 20 (see the drawings such as FIG. 1) of the first embodiment described above, substrate carrier 40 that holds substrate P is configured to be moved with a long stroke integrally with noncontact holder 32 in the scanning direction and to be moved with a long stroke separately from noncontact holder 32 in the non-scanning direction, whereas in substrate stage device 420 in the present second embodiment, inversely to the first embodiment described above, a substrate carrier 440 that holds substrate P is moved with a long stroke integrally with noncontact holder 32 in the non-scanning direction and is moved with a long stroke separately from noncontact holder 32 in the scanning direction, which is different from the first embodiment described above. That is, substrate stage device 420 related to the present second embodiment has a configuration, as a whole, like substrate stage device 20 related to the first embodiment described above being rotated around the Z-axis, for example, at an angle of 90 degrees. Note that the longitudinal direction of substrate P is substantially parallel to the X-axis, which is similar to the first embodiment described above.

Figure 14:
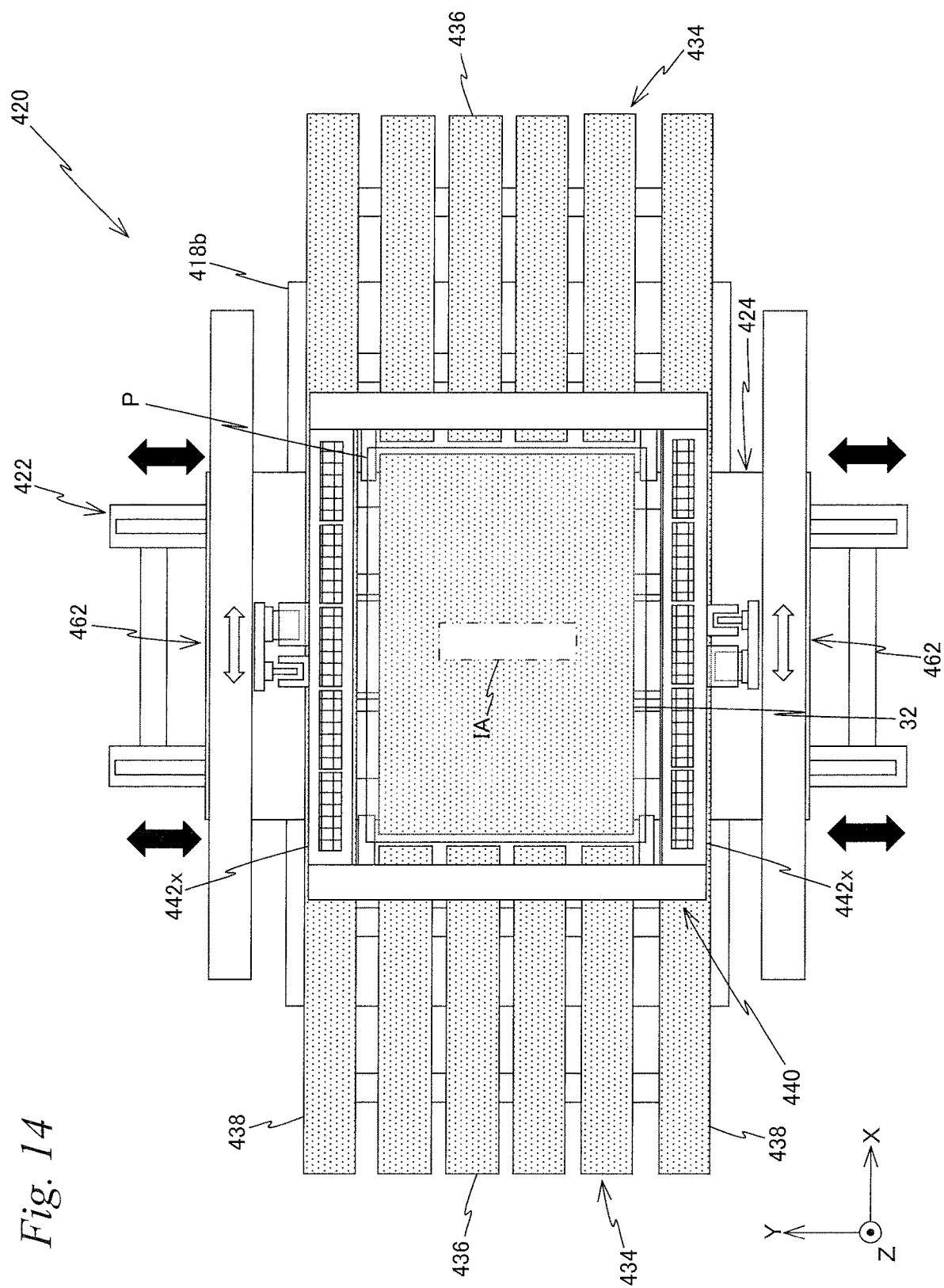
FIG. 14 is a view showing a substrate stage device related to a second embodiment.

The details of substrate stage device 420 will be described below. As illustrated in FIG. 14, substrate stage device 420 is equipped with: a base frame 422; a coarse movement stage 424; weight cancelling device 26 (not illustrated in FIG. 14. See the drawings such as FIG. 15a); a Y guide bar 428 (not illustrated in FIG. 14. See the drawings such as FIG. 15a); substrate table 30 (not illustrated in FIG. 14. See the drawings such as FIG. 17a); noncontact holder 32; a pair of auxiliary tables 434; substrate carrier 440; and the like. Since base frame 422, coarse movement stage 424, Y guide bar 428, the pair of auxiliary tables 434 and substrate carrier 440 referred to above are members that function similarly to base frame 22, coarse movement stage 24, X guide bar 28, the pair of auxiliary tables 34 and substrate carrier 40 (see FIGS. 1 and 2), those members will be briefly described below. Note that weight cancelling device 26, substrate table 30 and noncontact holder 30 are substantially the same as those in the first embodiment described above, respectively.

Figure 15A:
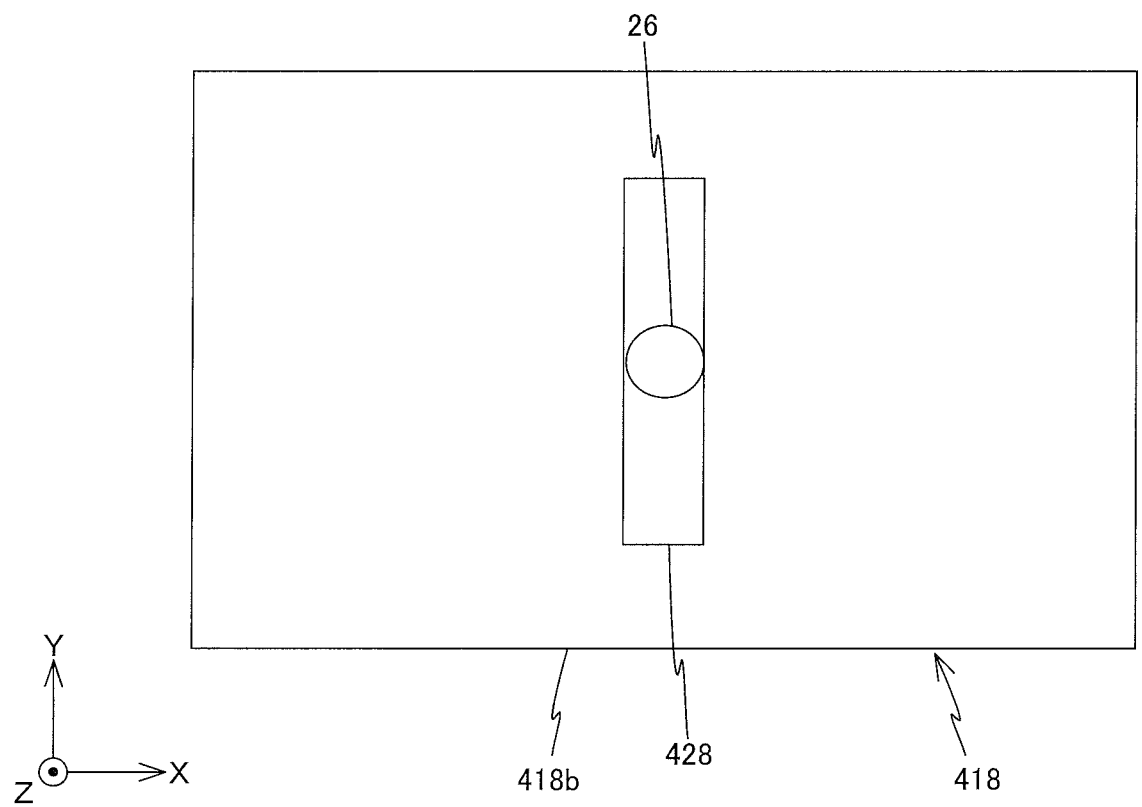
FIGS. 15a and 15b are views (a plan view and a side view, respectively) showing a Y guide bar, a weight cancelling device and the like that the substrate stage device shown in FIG. 14 has.
Figure 15B:
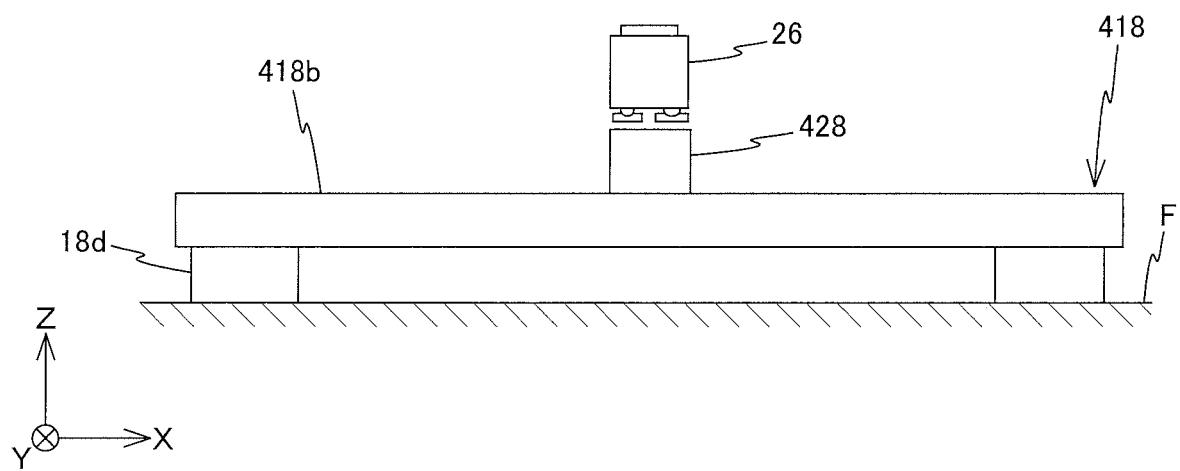
Figure 16A:
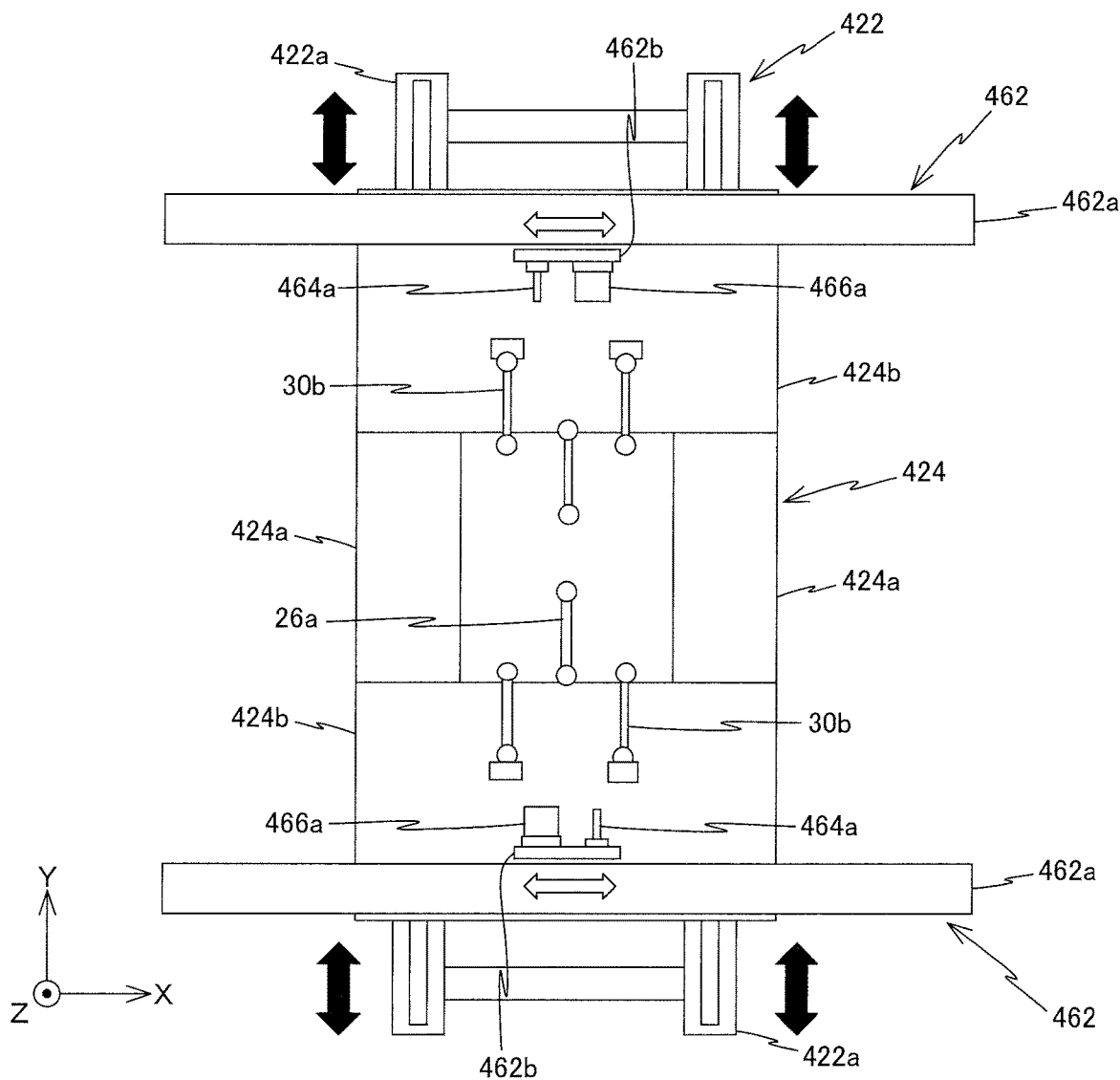
FIGS. 16a and 16b are views (a plan view and a side view, respectively) showing a base frame, a coarse movement stage and the like that the substrate stage device shown in FIG. 14 has.
Figure 16B:
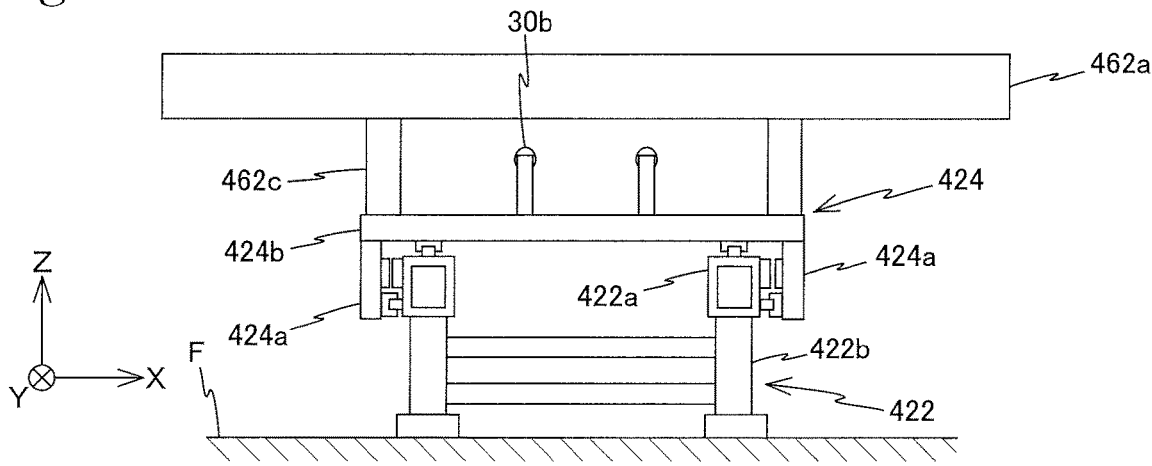

As illustrated in FIGS. 15a and 15b, in the present second embodiment, a lower mount section 418b that is a part of an apparatus main body 418 installed on floor F via vibration isolating devices 18d is made up of one plate-like member, and Y guide bar 428 is fixed to the upper surface of lower mount section 418b. On Y guide bar 428, weight cancelling device 26 is placed. Further, as illustrated in FIGS. 16a and 16b, base frame 422 has a pair of Y beams 422a installed on floor F via leg sections 422b, and coarse movement stage 424 is placed movable with a predetermined long stroke in the Y-axis direction on base fame 422. In the present second embodiment, coarse movement stage 424 has a pair of Y tables 424b that couple the +Y-side end vicinities of a pair of Y carriage 424a and couple the −Y-side end vicinities of the pair of Y carriage 424a. One ends of coupling devices 26a for towing weight cancelling device 26 (see the drawings such as FIG. 15a) and one ends of coupling devices 30b for towing substrate table 30 (see the drawings such as FIG. 17b) are coupled to Y tables 424b. Further, X stators 462a are fixed to the pair of Y tables 424b via support columns 462c. X stators 462a configure X linear actuators 462 together with X movers 462b. Further, a Y stator 464a and an X stator 466a are attached to X mover 462b.

Figure 17A:
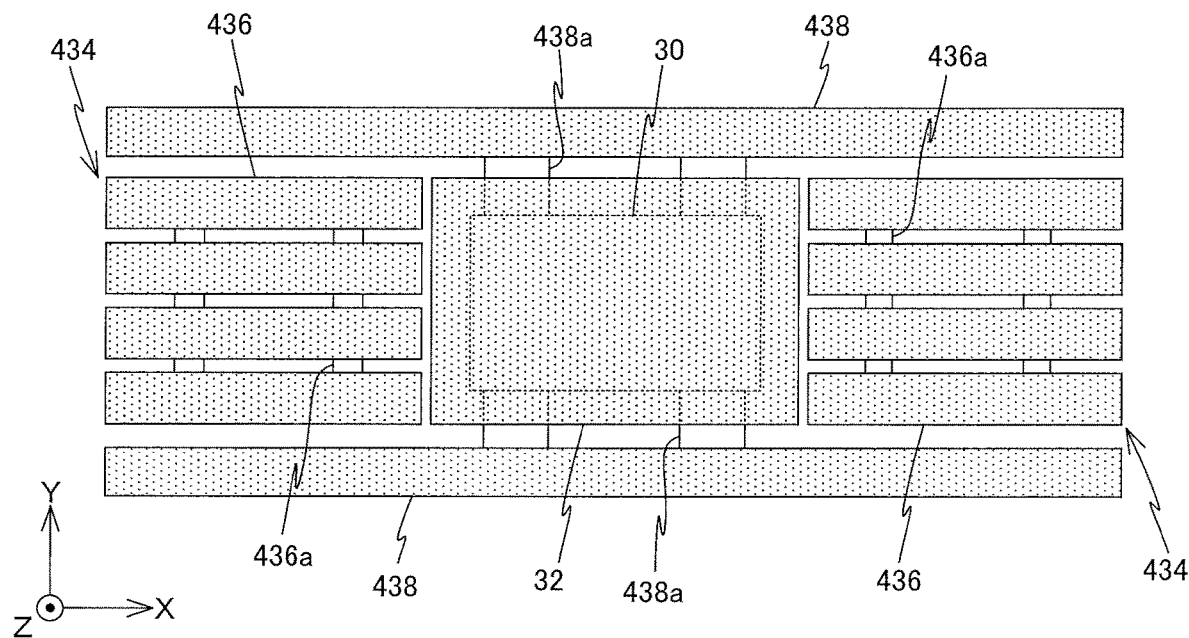
FIGS. 17a and 17b are views (a plan view and a side view, respectively) showing a noncontact holder, auxiliary tables, and the like that the substrate stage device shown in FIG. 14 has.
Figure 17B:
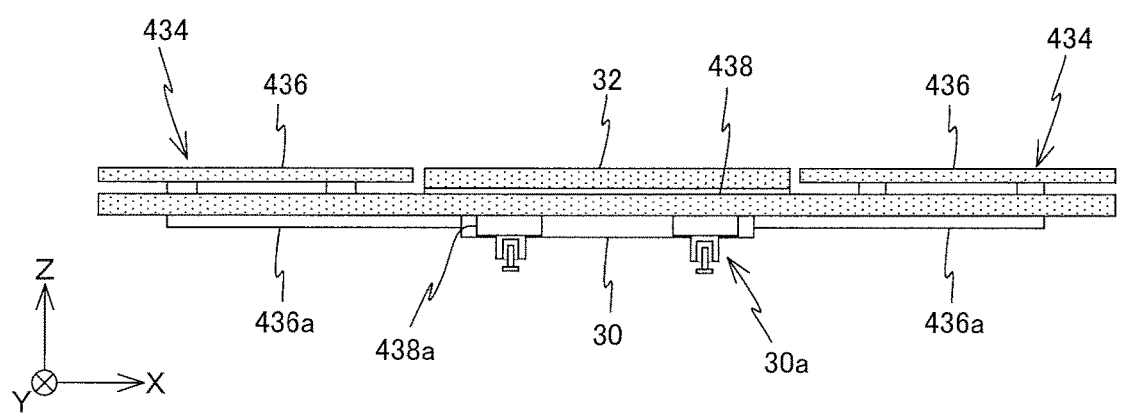

As illustrated in FIGS. 17a and 17b, substrate table 30 and noncontact holder 32 are each made up of a plate-like (or box-like) member having a rectangular shape with the X-axis direction serving as a longitudinal direction in planar view, which is similar to the first embodiment described above. Each of the pair of auxiliary tables 434 has a plurality of air levitation units 436 that are supported from below by an arm-like support member 436a that protrudes from the side surface of substrate table 30. Air levitation unit 436 is made up of a member extending in the X-axis direction, which is different from the first embodiment described above (see the drawings such as FIG. 3). Further, a pair of air levitation units 438 are coupled to substrate table 30 via support members 438a. Air levitation unit 438 functions similarly to air levitation unit 238 of the third modified example described above (see FIGS. 13a and 13b), except that air levitation unit 438 extends in the X-axis direction. That is, the pair of air levitation units 438 support a pair of X frames 442x that substrate carrier 440 has, from below in a noncontact manner, as illustrated in FIG. 14.

Figure 18A:
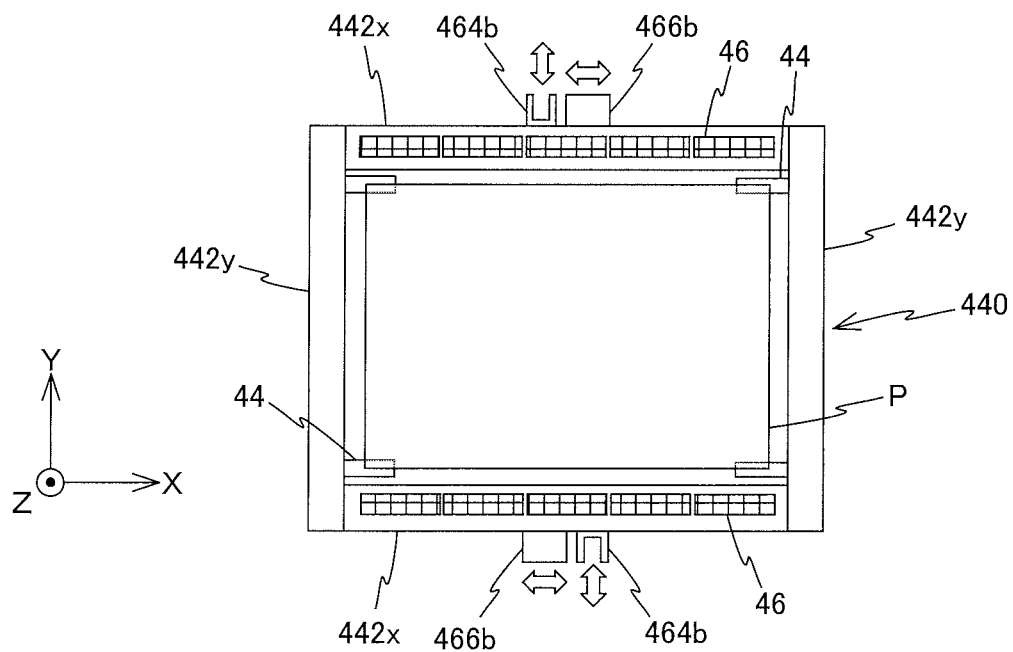
FIGS. 18a and 18b are views (a plan view and a side view, respectively) showing a substrate carrier and the like that the substrate stage device shown in FIG. 14 has.
Figure 18B:
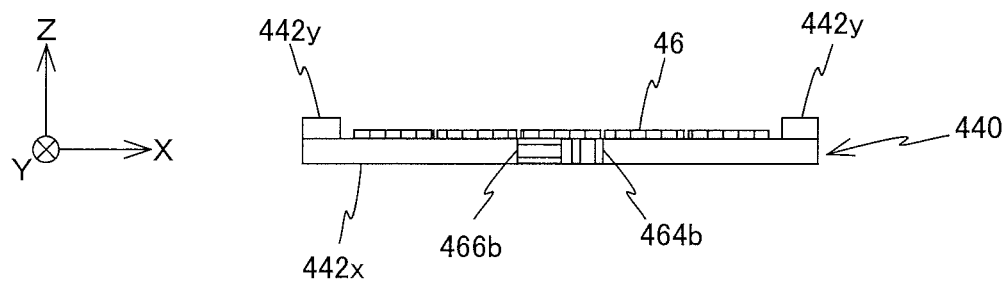

As illustrated in FIGS. 18a and 18b, substrate carrier 440 is made up of a rectangular frame-like (a picture-frame-like) member, which is similar to the first embodiment descried above (see the drawings such as FIG. 3), and has the pair of X frames 442x and a pair of Y frames 442y. Y frames 42y are attached to the lower surface side of X frames 42x (see FIG. 3) in substrate carrier 40 of the first embodiment described above, whereas Y frames 442y are attached to the upper surface side of X frames 442x in substrate carrier 440 of the present second embodiment. Accordingly, the contact between Y frames 442y and air levitation units 438 that auxiliary tables 434 have (see FIG. 14 for each of them) is avoided. Further, a plurality of adsorption pads 44 are attached to the lower surfaces of Y frames 442y. A plurality of scale plates 46 are attached to each of the pair of X frames 442x, which is the same as the first embodiment describe above. Further, on the side surface of each of the pair of X frames 442x, attached are a Y mover 464b and an X mover 466b that configure a Y voice coil motor 464 and an X voice coil motor 466 (see FIG. 20a for each of them) together with Y stator 464a and X stator 466a described above (see FIG. 16a for each of them), respectively. Since a position measurement system of substrate carrier 440 is the same as that in the first embodiment described above, the description thereof will be omitted.

Figure 19A:
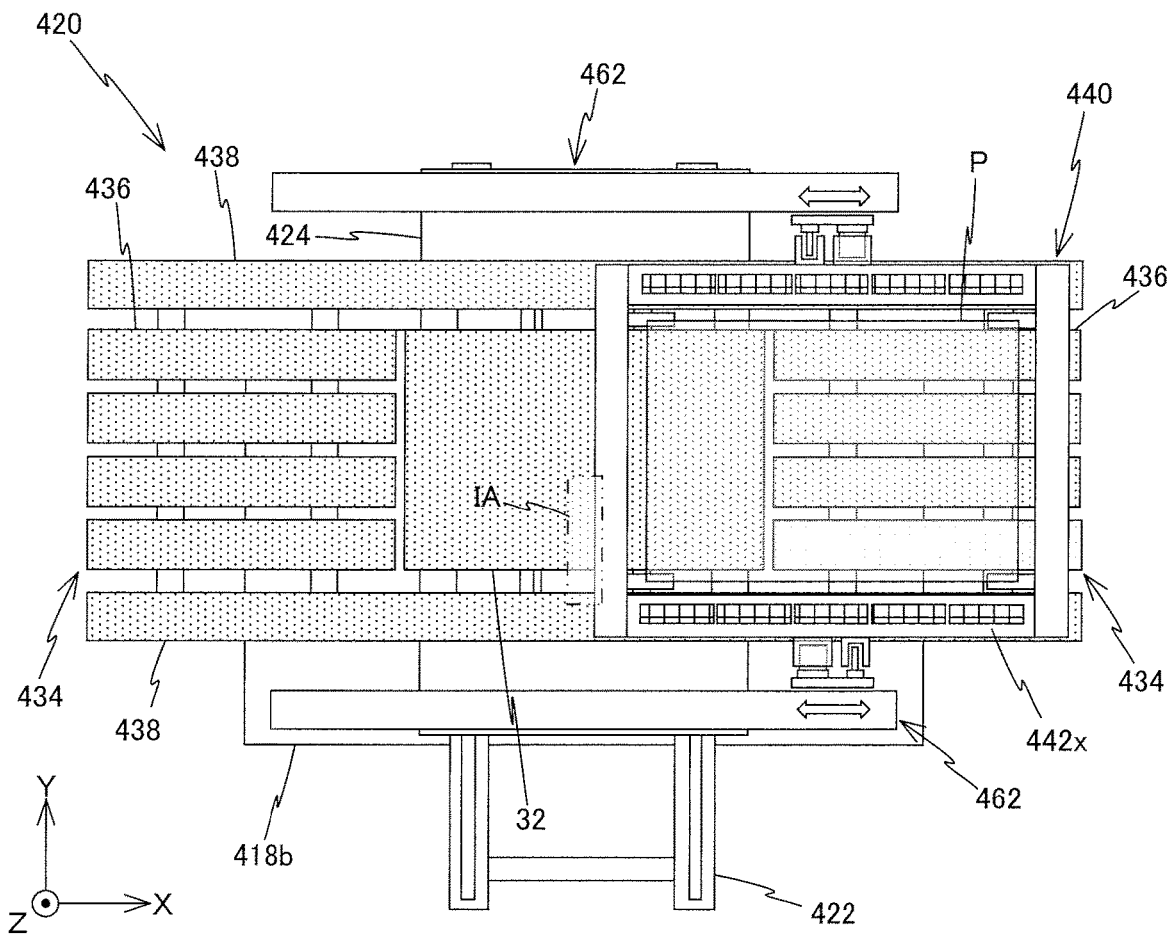
FIGS. 19a and 19b are views (a plan view and a side view, respectively) showing operations at the time of scanning exposure of the substrate stage device related to the second embodiment.
Figure 19B:
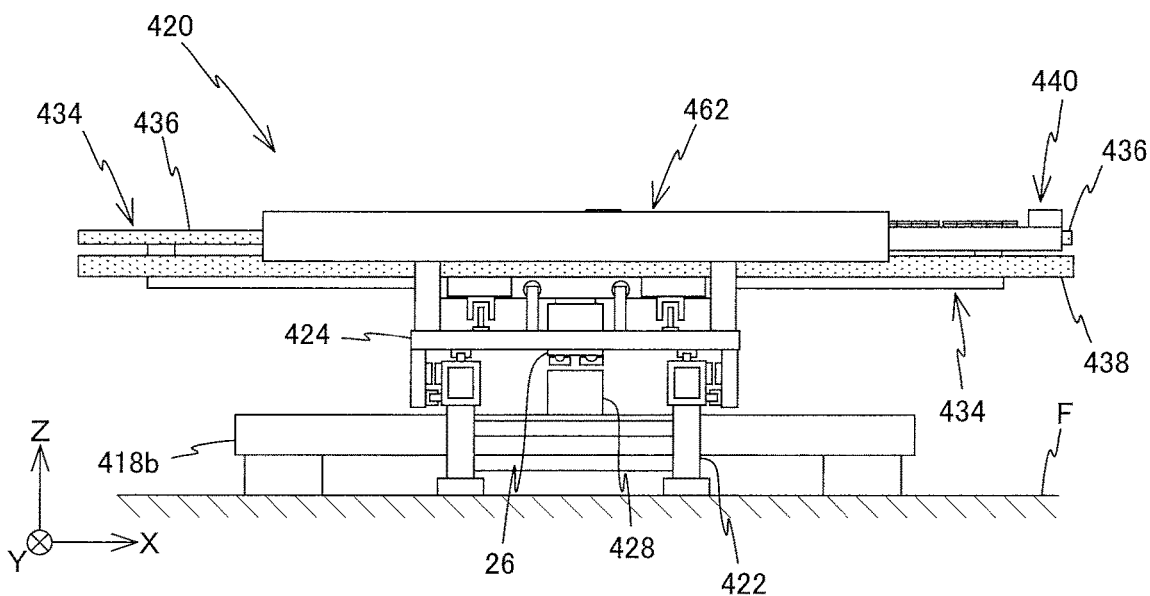

As illustrated in FIGS. 19a and 19b, main controller 50 performs the positioning of substrate P relative to exposure area IA in the X-axis direction by driving only substrate carrier 440 in the X-axis direction. An area, which is not supported by noncontact holder 32, of substrate P is supported by one of the pair of auxiliary tables 434. In exposure operations in the present second embodiment, since only substrate carrier 440 is driven with a long stroke relative to exposure area IA in the X-axis direction, substrate P passes through a space above noncontact holder 32 (in a state where a predetermined gap is formed in between). Noncontact holder 32 performs the flatness correction of substrate P passing through the space above, in a noncontact manner.

Figure 20A:
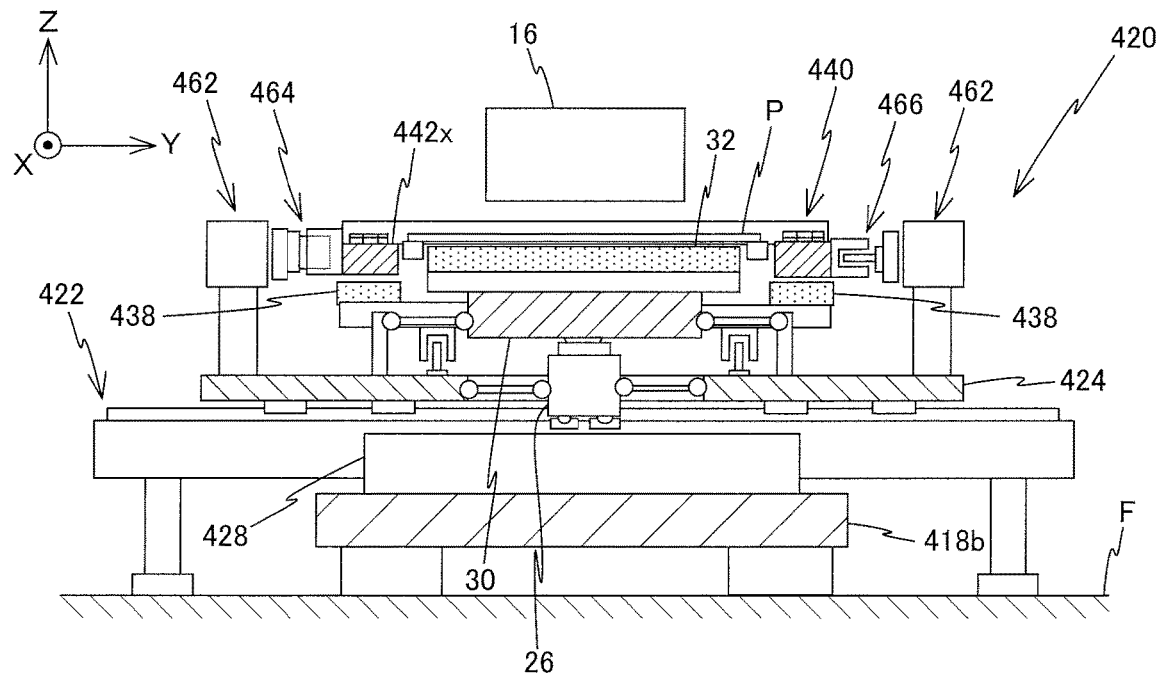
FIGS. 20a and 20b are views (No. 1 and No. 2) used to explain a Y step operation of the substrate stage device related to the second embodiment.
Figure 20B:
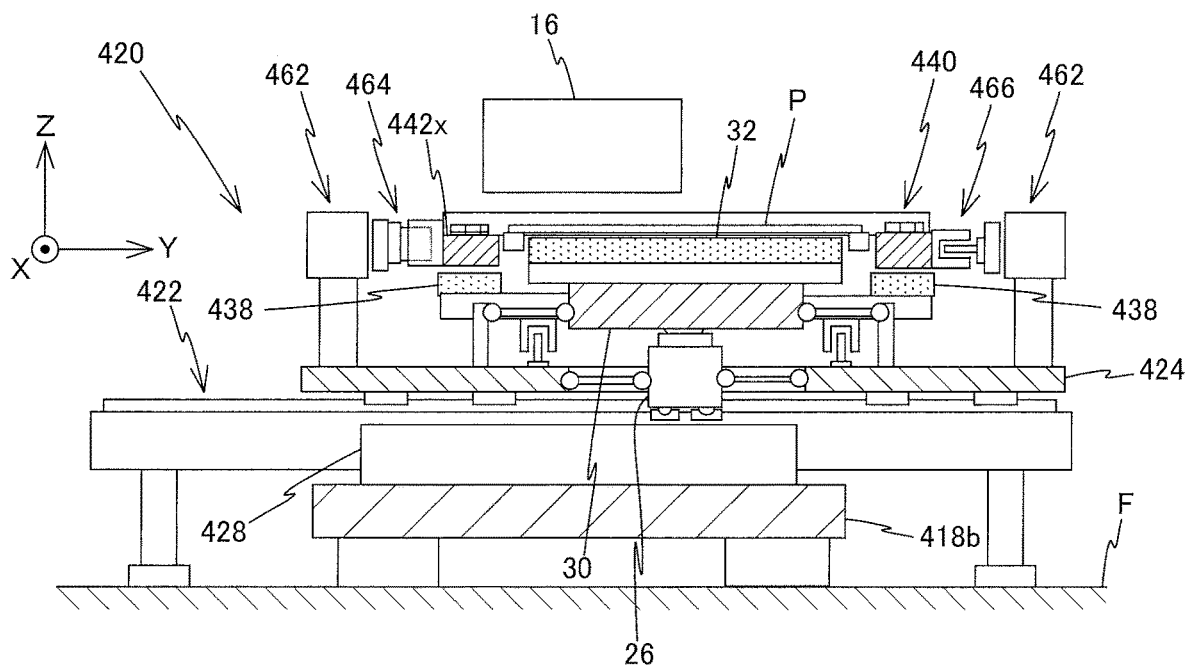
Figure 21:
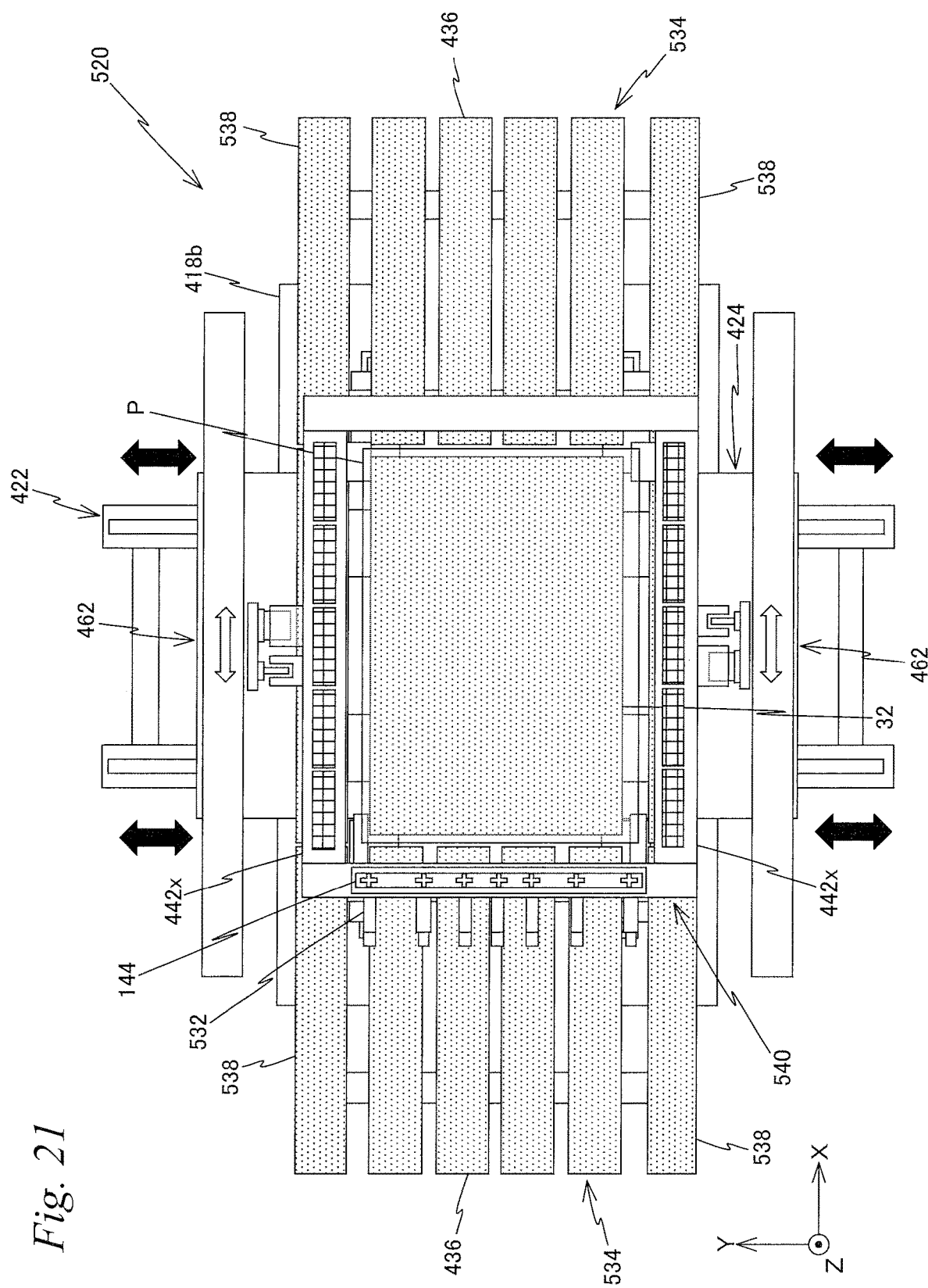
FIG. 21 is a view showing a substrate stage device related to a modified example of the second embodiment (a fourth modified example).

Further, as illustrated in FIGS. 20a and 20b, main controller 50 performs the positioning of substrate P relative to projection optical system 16 (i.e. exposure area IA (see FIG. 19a)) in the Y-axis direction, by driving coarse movements stage 424 and noncontact holder 32 with a predetermined long stroke in the Y-axis direction and also moving substrate carrier 440 integrally with coarse movement stage 424 in the Y-axis direction.

According to the second embodiment described so far, since only substrate carrier 440 is driven in the scanning direction at the time of scanning exposure, the vibration can be prevented from being generated, compared to the first embodiment described above (see the drawings such as FIG. 8a) in which noncontact holder 32 and the pair of auxiliary tables 34 also need to be driven in the scanning direction, and therefore the high accuracy exposure operations can be performed. Further, since weight cancelling device 26 is moved only at the time of the Y-step operation, the size of Y guide bar 428 in the longitudinal direction is shorter, compared to that of X guide bar 28 in the first embodiment described above. Further, since weight cancelling device 26 is in a static state at the time of exposure operations, the flatness degree of the guide surface of Y guide bar 428 serving as a surface plate for weight cancelling device 26 may be rough, compared to the first embodiment described above.

Note that the configuration described in the present second embodiment is an example, and can be modified as needed. For example, as in a substrate stage device 520 related to a modified example of the second embodiment (a fourth modified example) illustrated in FIGS. 21*a* to 26*b*, a pair of auxiliary tables 534 may be physically separated from substrate table 30 (see FIG. 24*a*). With regard to the fourth modified example, hereinafter only the differences from the second embodiment described above will be described, and common elements will be provided with the same reference signs as those in the second embodiment described above, and the description thereof will be omitted.

Figure 22A:
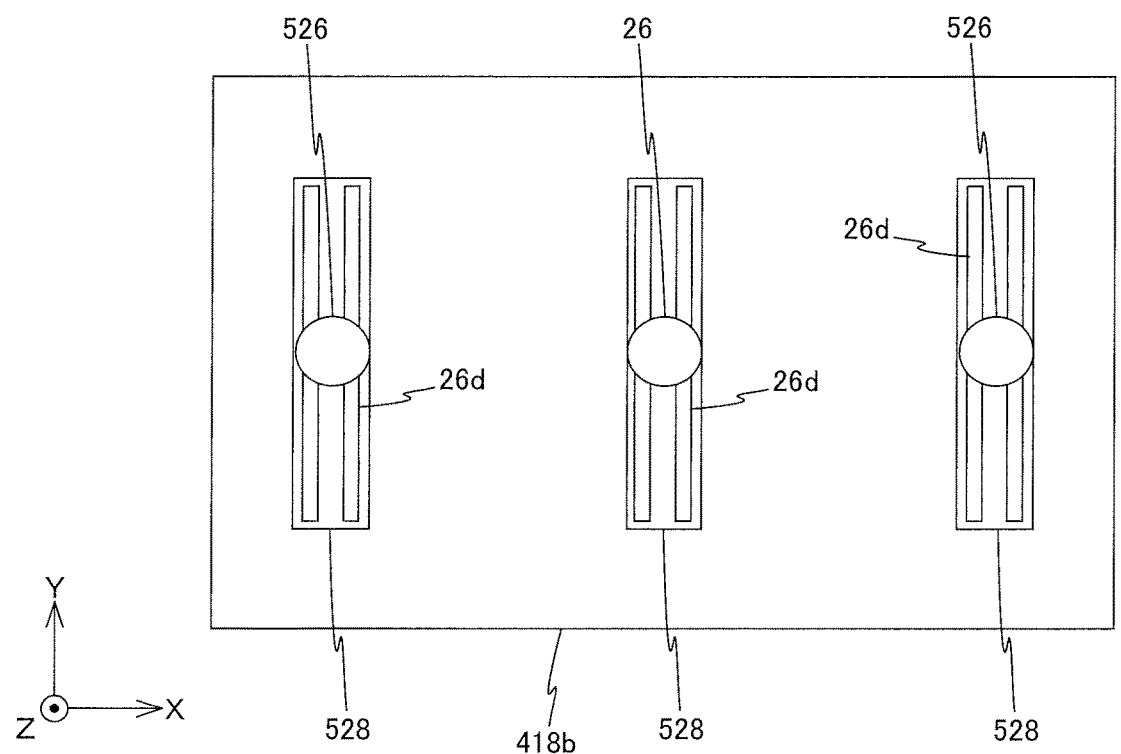
FIGS. 22a and 22b are views (a plan view and a side view, respectively) showing a Y guide bar, a weight cancelling device and the like that the substrate stage device shown in FIG. 21 has.
Figure 22B:
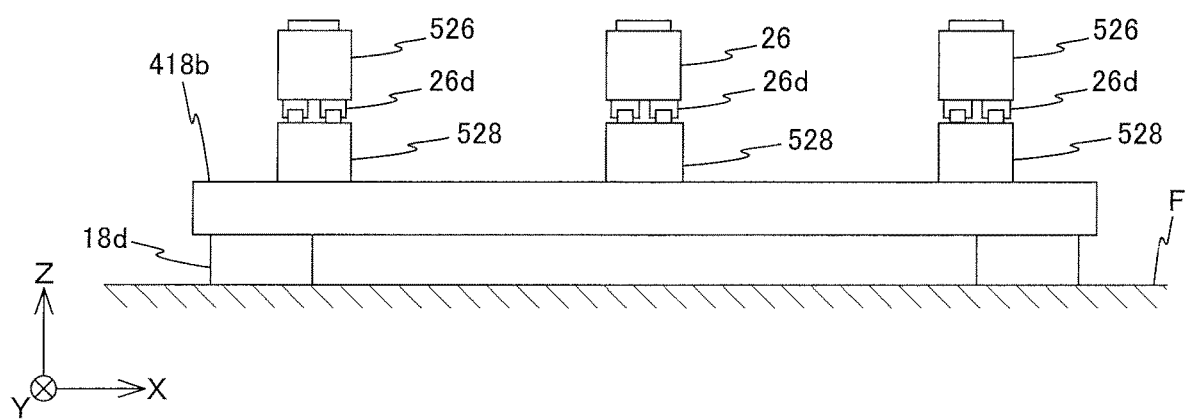

As illustrated in FIGS. 22*a* and 22*b*, for example, three Y guide bars 528 are fixed, at a predetermined pacing in the X-axis direction, on lower mount section 418*b*. Y guide bar 528 is formed with a size and a shape similar to those of Y guide bar 428 (see the drawings such as FIG. 15*a*) in the second embodiment described above. In the present fourth modified example, however, weight cancelling device 26 is placed on Y guide bar 528 via a mechanical linear guide device 26*d*, and therefore the flatness degree of the upper surface of Y guide bar 528 is rough, compared to that of Y guide bar 428 related to the second embodiment described above. Further, a Z actuator 526 is placed on Y guide bars 528 on the +X side and the −X side via Y linear guide device 26*d*.

Figure 23A:
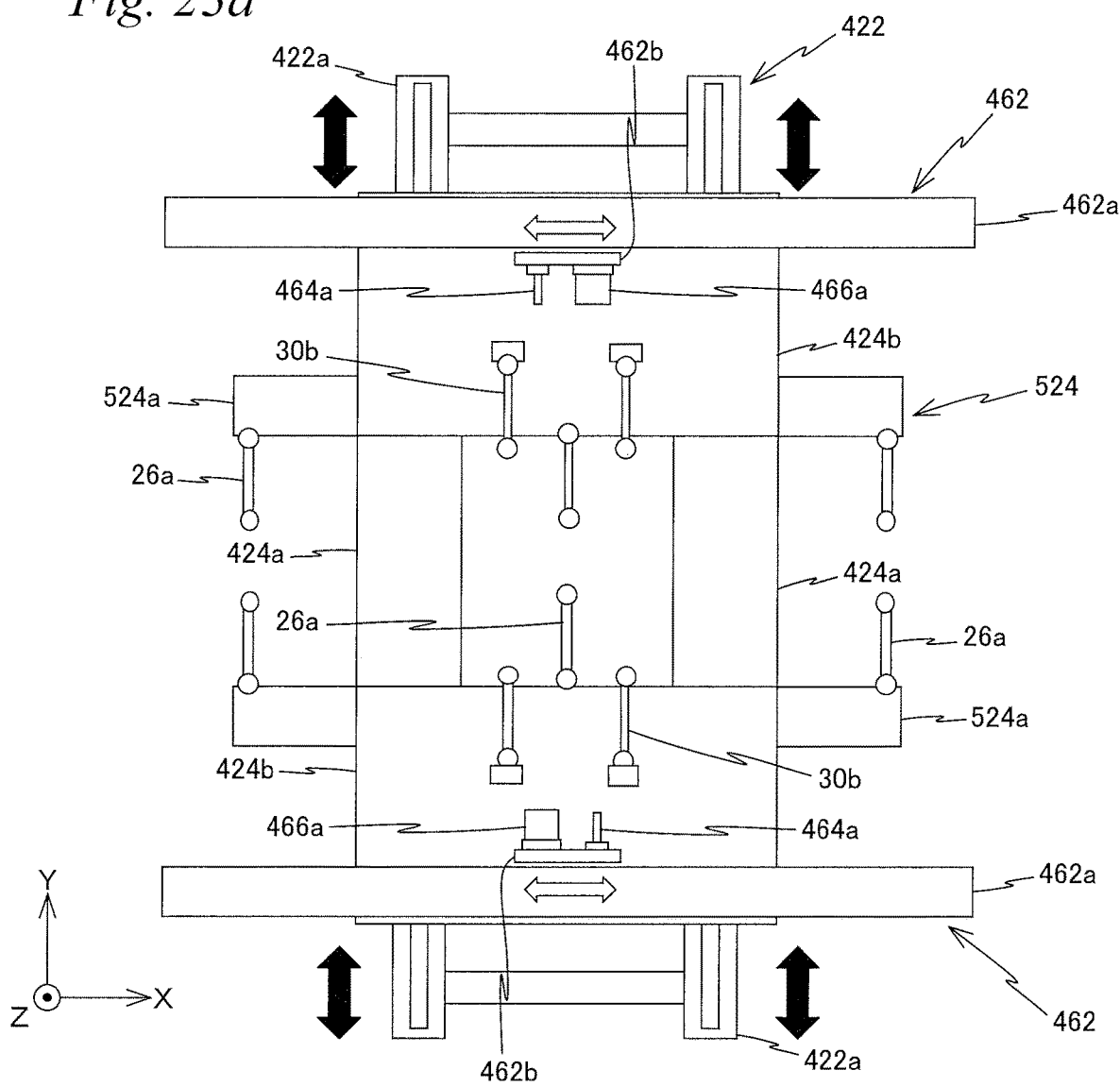
FIGS. 23a and 23b are views (a plan view and a side view, respectively) showing a base frame, a coarse movement stage and the like that the substrate stage device shown in FIG. 21 has.
Figure 23B:
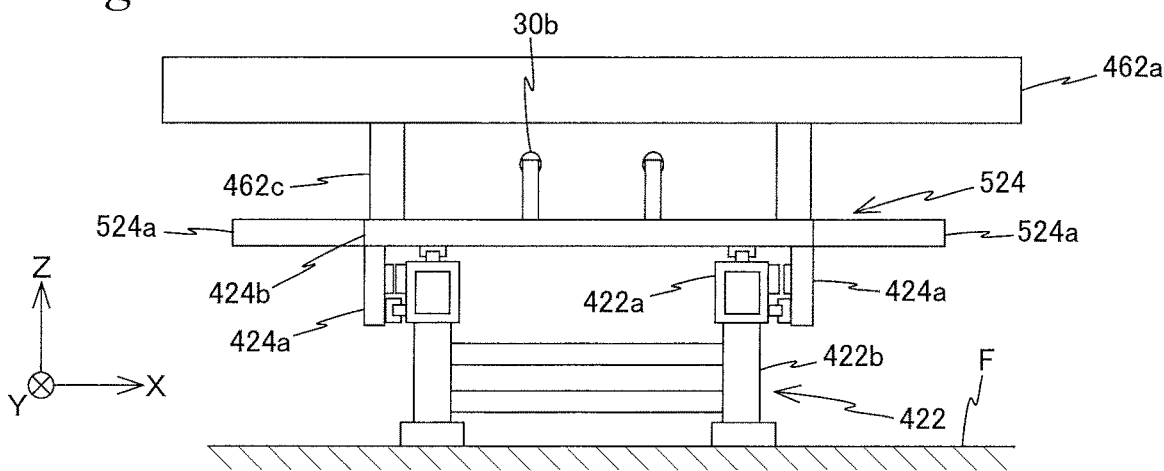

Further, as illustrated in FIGS. 23*a* and 23*b*, to each of a pair of Y tables 424*b* that a coarse movements stage 524 has, a pair of plate-like members 524*a* are coupled protruding toward the +X direction and the −X direction. One ends of coupling devices 26*a* for towing Z actuators 526 (see the drawings such as FIG. 22*b*) are coupled to plate-like members 524*a*. That is, in the present fourth modified example, for example, two Z actuators 526 (see the drawings such as FIG. 22*b* for each of them) are towed by coarse movement stage 524 in a similar manner to weight cancelling device 26 (integrally with weight cancelling device 26).

Figure 24A:
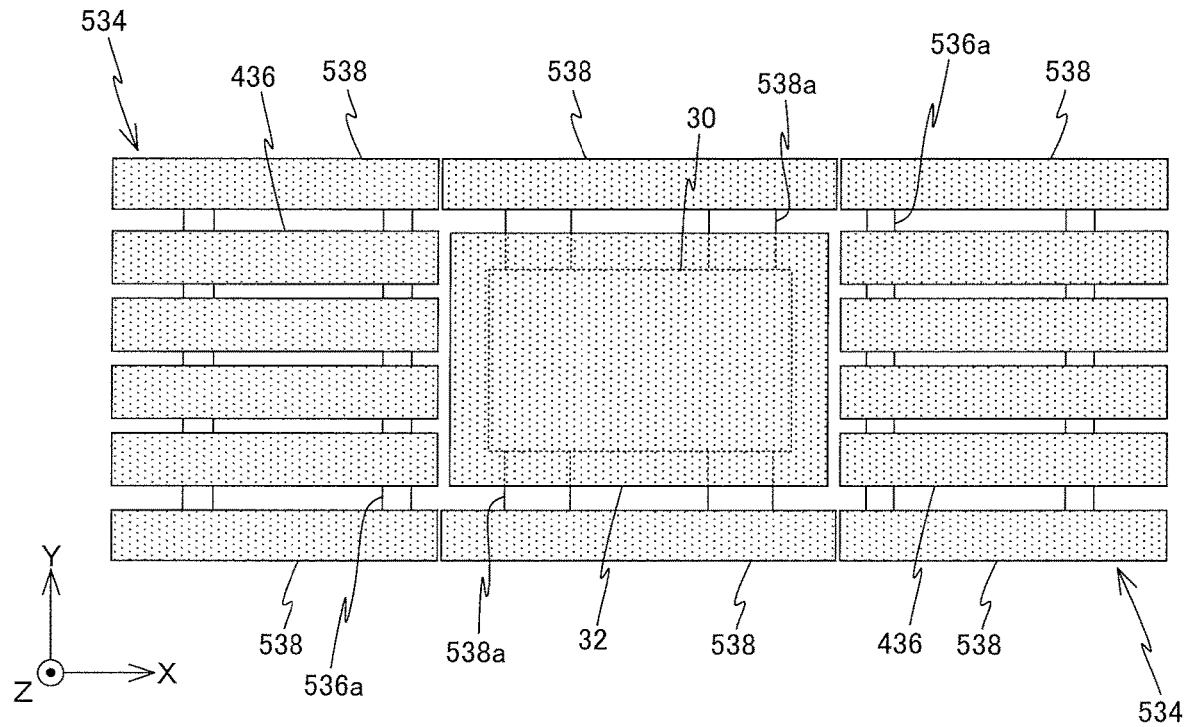
FIGS. 24a and 24b are views (a plan view and a side view, respectively) showing a noncontact holder, auxiliary tables, and the like that the substrate stage device shown in FIG. 21 has.
Figure 24B:
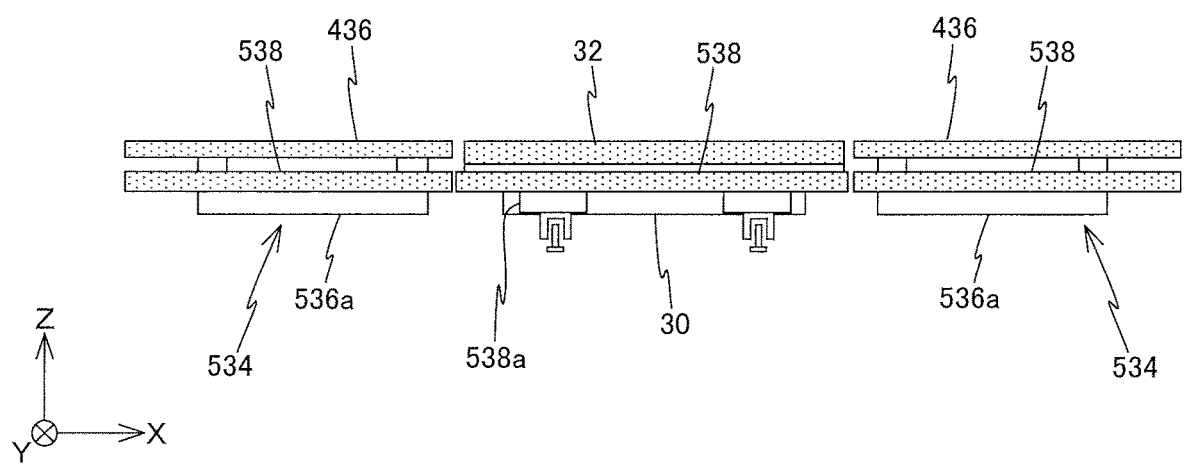

As illustrated in FIGS. 24*a* and 24*b*, each of the pair of auxiliary tables 534 has a plurality (e.g. four in FIG. 24*a*) of air levitation units 436. Similarly to the second embodiment described above, the plurality of air levitation units 436 support a portion, of substrate P, that is not supported by noncontact holder 32. Further, auxiliary table 534 has a pair of air levitation units 538. In auxiliary table 534, the plurality of air levitation units 436 and the pair of air levitation units 538 are integrally placed on a base member 536*a*. Auxiliary table 534 on the +X side is supported from below by Z actuator 526 (see the drawings such as FIG. 22*b*) on the +X side described above, while auxiliary table 534 on the −X side is supported from below by Z actuator 526 (see the drawings such as FIG. 22*b*) on the −X side described above (see FIG. 26*b*). Further, a pair of air levitation units 538 are also fixed to substrate table 30 via support members 538*a*. Note that air levitation unit 438 of the second embodiment described above is formed with a length capable of covering the entire movement range of substrate carrier 440 (about three times the length of substrate P) in the X-axis direction (see FIG. 14 for each of them), whereas air levitation unit 538 of the present modified example is formed with a length that is about the same as the length of the other air levitation unit 436 (about the same as the length of substrate P).

Similarly to the second embodiment described above, also in the present fourth modified example, X frames 442*x* of substrate carrier 540 (see FIG. 21 for each of them) are supported from below, as needed, by the plurality of air levitation units 538 (air levitation units 538 that auxiliary tables 534 have and air levitation units 538 that substrate 30 has).

Figure 25A:
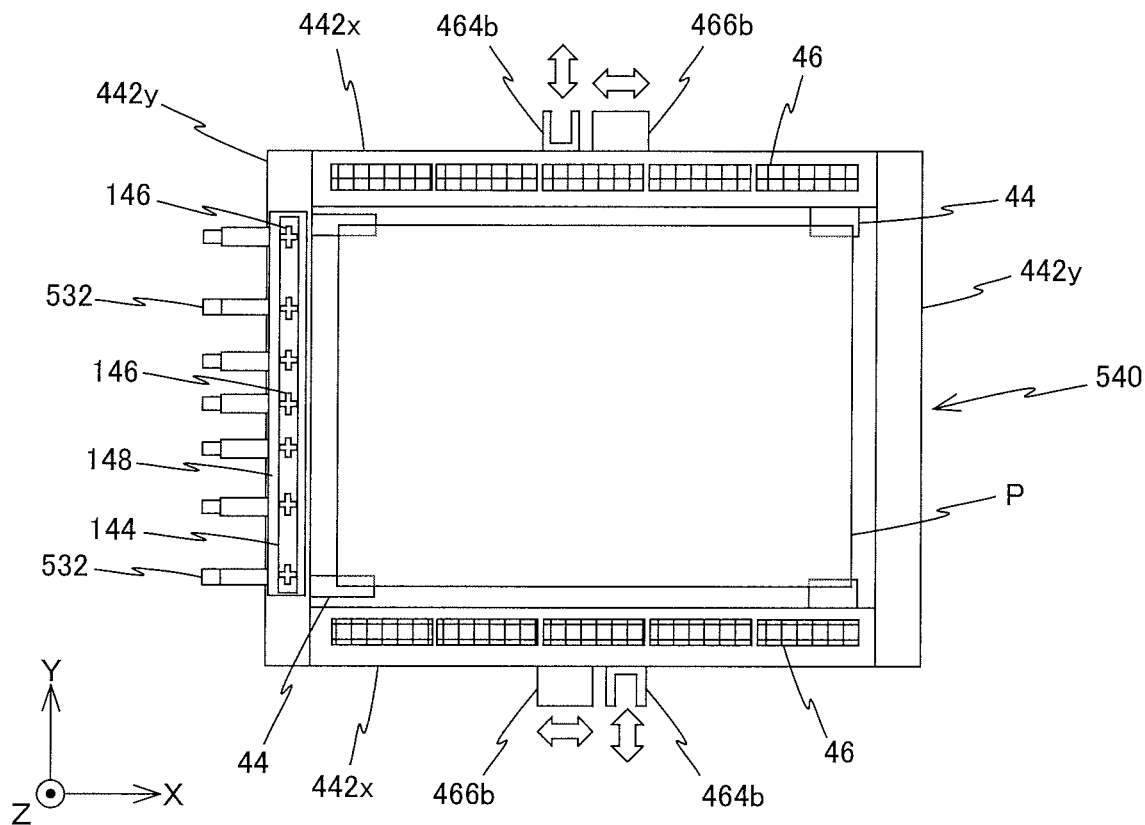
FIGS. 25a and 25b are views (a plan view and a side view, respectively) showing a substrate carrier and the like that the substrate stage device shown in FIG. 21 has.
Figure 25B:
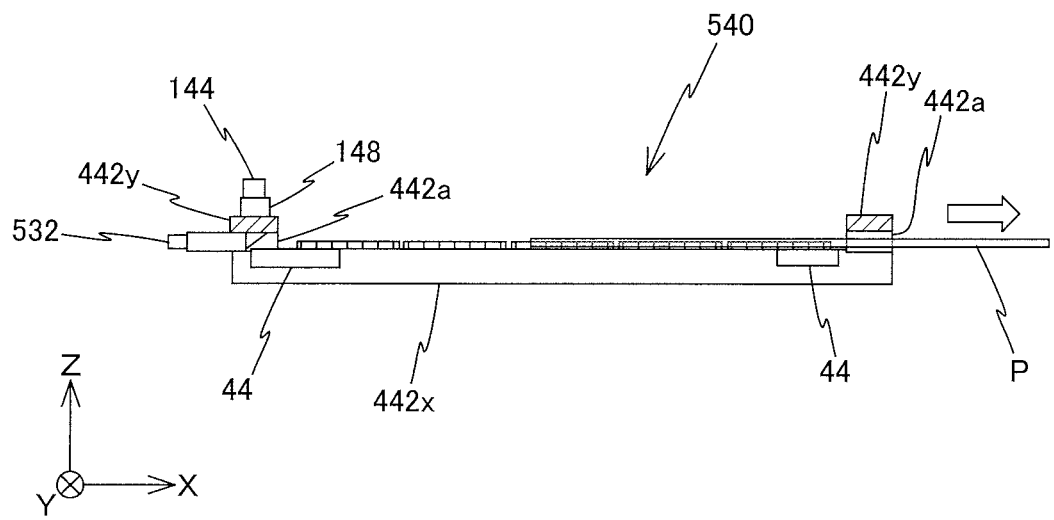

As illustrated in FIGS. 25*a* and 25*b*, in substrate carrier 540, Y frames 442*y* are supported on X frames 442*x* via spacers 442*a* (not illustrated in FIG. 25*a* because spacers 442*a* are hidden behind Y frames 442*y*). Further, a pair of adsorption pads 44 on the −X side are attached to the lower surface of Y frame 442*y* on the −X side, whereas a pair of adsorption pads 44 on the +X side are formed protruding from the inner side surfaces of X frames 442*x*. Accordingly, in substrate carrier 540 of the present modified example, the carry-out of substrate P from substrate carrier 540 can be performed, by moving substrate P, from the state shown in FIG. 25*a*, toward the +X direction and causing substrate P to pass below Y frame 442*y* on the +X side as illustrated in FIG. 25*b*. Further, the carry-in of substrate P to substrate carrier 540 can also be performed, by moving substrate P toward the −X direction.

Further, reference index plate 144, at which the plurality of reference marks 146 are formed, is fixed via raising member 148, which is similar to the second modified example (see FIG. 12*a*) of the first embodiment described above. Further, corresponding to the plurality of reference marks 146, a plurality of mark measurement sensors 532 are attached to the lower surface of Y frame 442*y* on the −X side. That is, reference index plate 144 and mark measurement sensors 132 are separately provided in the second modified example described above (see FIG. 11), whereas reference index plate 144 and mark measurement sensors 532 are integrally provided at substrate carrier 540 in the present modified example. Since the calibration using reference index plate 144 is the same as the second modified example described above, the description thereof will be omitted.

Figure 26A:
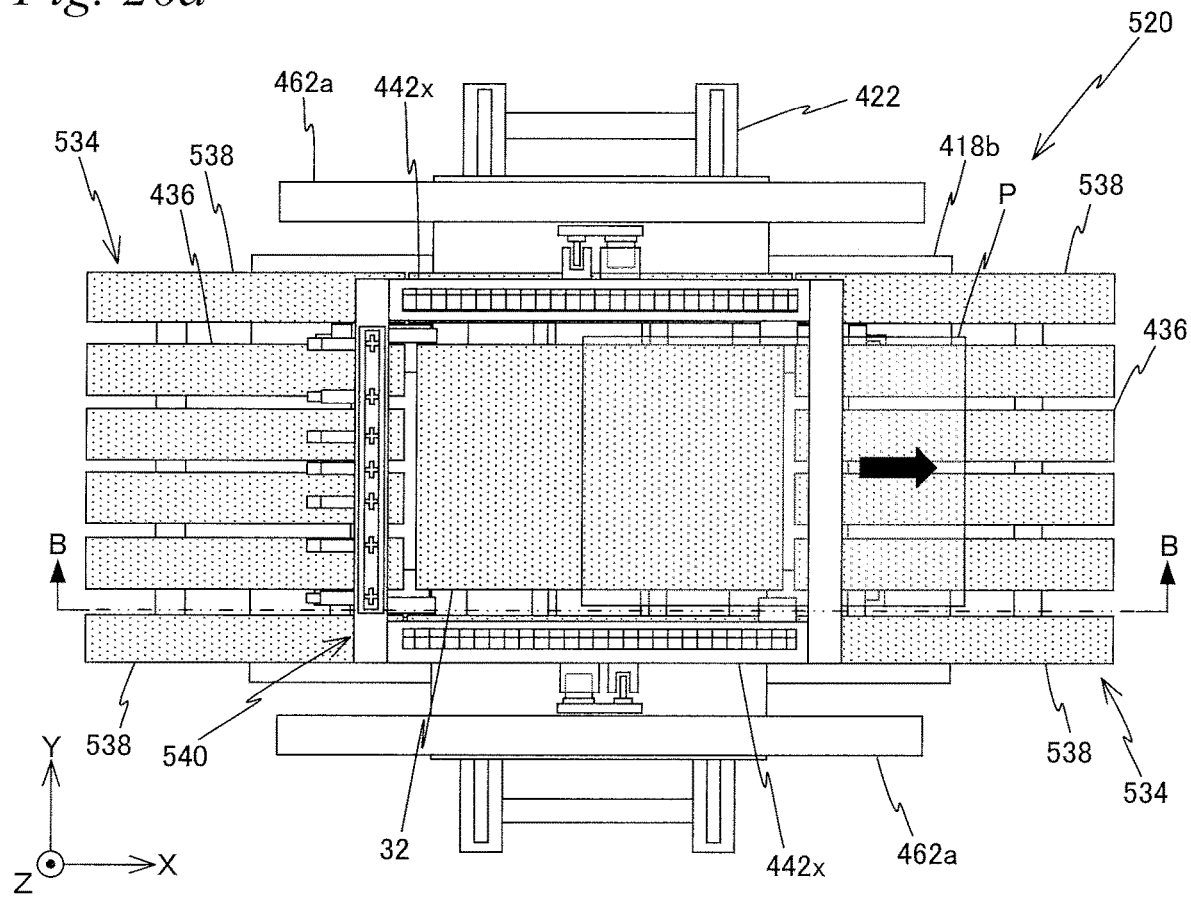
FIG. 26a is a view used to explain the substrate carry-out time of the substrate stage device related to the fourth modified example.
Figure 26B:
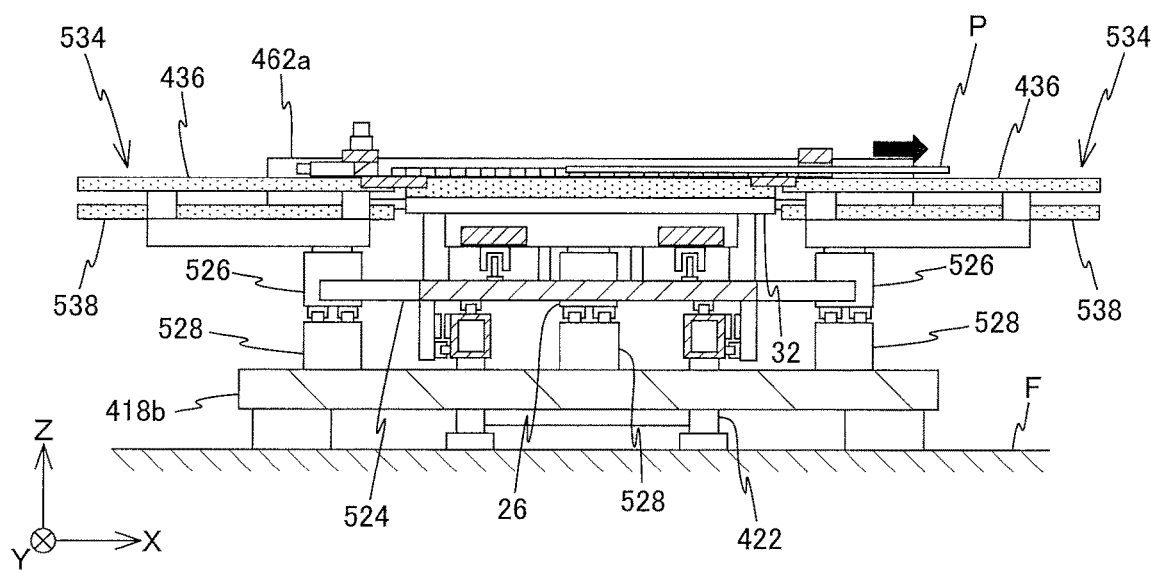

In FIGS. 26*a* and 26*b*, substrate stage device 520 at the time of carry-out operations of substrate P is illustrated. The carry-out of substrate P is performed in a state where substrate carrier 540 is in the center of the movement range in the X-axis direction, i.e., substantially the entirety of substrate P is supported by noncontact holder 32. After the holding by adsorption of substrate P by substrate carrier 540 is released, substrate P is slid and moved in the +X direction with respect to substrate carrier 540 by a carry-out device (not illustrated). Accordingly, substrate P is delivered (transferred) onto the plurality of air levitation units 438 that auxiliary table 534 on the +X side has. Note that the carry-out device for sliding substrate P in the X-axis direction may be provided external to substrate stage device 520 (including an external device of the liquid crystal exposure apparatus), or substrate stage device 520 itself may have the carry-out device.

In substrate stage device 520 (see FIG. 21) related to the fourth modified example described so far, since the pair of auxiliary tables 534 and substrate table 30 (and noncontact holder 32) are physically separated, the Z-tilt position controllability of substrate P is improved by weight reduction of an object to be driven. Further, the respective Z-positions of the pair of auxiliary tables 534 can be independently controlled, and therefore, for example, when substrate P is moved (transferred) from noncontact holder 32 onto air levitation units 436 of auxiliary table 534, the contact between the end of substrate P and air levitation units 436 can be avoided by slightly lowering the Z-position of that auxiliary table 534. Further, substrate P can be carried out from (and carried into) substrate carrier 540 by sliding and moving substrate P, and therefore, even in the case when a space above substrate stage device 520 is small, the substrate exchange on substrate carrier 540 can be performed easily.

Note that the configurations of the first embodiment and the second embodiment (including their modified examples) described above are examples, and can be changed as needed. For example, although in each of the embodiments described above, substrate carrier 40 or the like is formed into a rectangular frame-like shape by, for example, four frame members along the outer periphery edges (four sides) of substrate P (in the first embodiment, a pair of X frames 42x and a pair of Y frames 42y), this is not intended to be limiting as far as the holding by adsorption of substrate P can be reliably performed. And, substrate carrier 40 or the like may be configured of frame members, for example, along a part of the outer periphery edges of substrate P. Specifically, the substrate carrier may be formed into a U-like shape in planar view by, for example, three frame members along three sides of substrate P, or may be formed into an L-like shape in planar view by, for example, two frame members along two adjacent sides of substrate P. Further, the substrate carrier may be formed by, for example, only one frame member along one side of substrate P. Further, the substrate carrier may be configured by a plurality of members which hold portions different from each other of substrate P and whose positions are controlled independently from each other.

Note that as illustrated in FIG. 2 or 13, although Z-tilt position measurement system 58 irradiates target 58b fixed to the housing of weight cancelling device 26 with a measurement beam, using laser displacement meter 58a provided at the lower surface of substrate table 30, and receives the reflected beam, thereby obtaining displacement amount information of substrate table 30 in the Z-axis direction, this is not intended to be limiting. Instead of Z-tilt position measurement system 58, Z sensor heads 78z are disposed at head units 72, along with X heads 78x and Y heads 78y. As Z sensor head 78z, for example, a laser displacement meter is used. In an area, of X frame 42x, in which the scales that face X heads 78x and Y heads 78y are not disposed, a reflection surface is formed by mirror polishing. Z sensor head 78z irradiates the reflection surface with a measurement beam and receives the reflected beam from the reflection surface, thereby obtaining displacement amount information of substrate carrier 40 or 440 in the Z-axis direction at the irradiation point of the measurement beam. Note that the type of Z head 78z is not particularly limited, as far as Z head 78z can measure the displacement of substrate carrier 40 or 440 (for more detail, X frame 42x) in the Z-axis direction with apparatus main body 18 (see FIG. 1) serving as a reference, with a desired accuracy (resolution) and in a noncontact manner.

Further, although the position information of each of substrate P and Y sliders 76 within the XY plane is obtained by X encoder heads 78x and Y encoder heads 78y, Z-tilt displacement amount information of each of substrate P and Y sliders 76 may also be obtained together with the position information of each of substrate P and Y sliders 76 within the XY plane, by using, for example, a two-dimensional encoder head (an XZ encoder head or a YZ encoder head) that is capable of measuring displacement amount information in the Z-axis direction. In this case, Z-tilt position measurement system 58 and Z sensor heads 78z for obtaining the Z-tilt position information of substrate P can be omitted. Note that, in this case, since two downward Z heads need to constantly face scale plate 46 in order to obtain the Z-tilt position information of substrate P, it is preferable that scale plate 46 is configured of one long scale plate with a length that is about the same as the length of X frame 42x, or for example, three or more of the two-dimensional encoder heads described above are disposed at a predetermined spacing in the X-axis direction.

Further, although in each of the embodiments described above, a plurality of scale plates 46 are disposed at a predetermined spacing in the X-axis direction, this is not intended to be limiting, and for example, one long scale plate formed with a length about the same as the length of substrate carrier 40 or the like in the X-axis direction may be used. In this case, since the facing state between the scale plate and the heads is constantly maintained, each head unit 72 only has to have one each of X head 78x and Y head 78y. The same can be said for scale plate 82. In the case when a plurality of scale plates 46 are provided, the respective lengths of the plurality of scale plates 46 may be different from each other. For example, the length of a scale plate extending in the X-axis direction is set longer than the length of a shot area in the X-axis direction, and thereby the position control of substrate P by head unit 72 that is located across the different scale plates 46 can be avoided at the time of scanning exposure operations. Further (for example, in the case of preparing four areas and the case of preparing six areas), a scale disposed on one side of projection optical system 16 and a scale disposed on the other side may have the respective lengths different from each other.

Further, although, in each of the embodiments described above, the position measurement of substrate carrier 40 or the like within the horizontal plane is performed using the encoder systems, this is not intended to be limiting, and for example, bar mirrors each extending in the X-axis direction and the Y-axis direction are attached to substrate carrier 40, and the position measurement of substrate carrier 40 or the like may be performed by an interferometer system using the bar mirrors. Further, although in the encoder systems in each of the embodiments described above, such a configuration is employed that substrate carrier 40 or the like has scale plates 46 (diffraction gratings) and head units 72 have the measurement heads, this not intended to be limiting, and substrate carrier 40 or the like may have the measurement heads and scale plates that are moved synchronously with the measurement heads may be attached to apparatus main body 18 (the arrangement reversed to that in each of the embodiments described above may be employed).

Further, the case when air levitation units 36 are moved together with noncontact holder 32 in the X-axis direction in the first embodiment and in the Y-axis direction in the second embodiment has been described, the configuration is not limited thereto. In the first embodiment, for example, a configuration may be employed in which, when substrate P is moved in the X-axis direction, air levitation units 36 are also fixedly disposed without being moved in the X-axis direction by disposing air levitation units 36 with a length capable of suppressing the bending of substrate P (air levitation units 36 that cover the movement range of substrate P) on at least one of the +Y side and the −Y side of noncontact holder 32. In the second embodiment, for example, a configuration may be employed in which, when substrate P is moved in the Y-axis direction, air levitation units 36 are also fixedly disposed without being moved in the Y-axis direction by disposing air levitation units 36 with a length capable of suppressing the bending of substrate P (air levitation units 36 that cover the movement range of substrate P) on at least one of the +X side and the −X side of noncontact holder 32.

Further, although in each of the embodiments described above, noncontact holder 32 supports substrate P in a noncontact manner, this is not intended to be limiting as far as the relative movement of substrate P and noncontact holder 32 in directions parallel to the horizontal plane is not blocked, and substrate P may be supported in a contact state via a rolling element such as, for example, a ball.

Further, a light source used in illumination system 12 and the wavelength of illumination light IL irradiated from the light source are not particularly limited, and for example, may be ultraviolet light such as an ArF excimer laser beam (with a wavelength of 193 nm) or a KrF excimer laser beam (with a wavelength of 248 nm), or vacuum ultraviolet light such as an $F_2$ laser beam (with a wavelength of 157 nm).

Further, although in each of the embodiments described above, an unmagnification system is used as projection optical system 16, the projection optical system is not limited thereto, and a reduction system or a magnifying system may be used.

Further, the use of the exposure apparatus is not limited to the exposure apparatus for liquid crystal display devices that transfers a liquid crystal display device pattern onto a square-shaped glass plate, but can be widely applied also to, for example, an exposure apparatus for manufacturing organic EL (Electro-Luminescence) panels, an exposure apparatus for manufacturing semiconductor devices, and an exposure apparatus for manufacturing thin-film magnetic heads, micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a mask or a reticle used in an exposure apparatus such as an optical exposure apparatus, an EUV exposure apparatus, an X-ray exposure apparatus, or an electron beam exposure apparatus.

Further, an object serving as an exposure target is not limited to a glass plate, but may be other objects such as, for example, a wafer, a ceramic substrate, a film member, or a mask blank. Further, in the case when an object to be exposed is a substrate for flat-panel display, the thickness of the substrate is not particularly limited, and for example, a film-like member (a sheet-like member with flexibility) is also included. Note that the exposure apparatus of the present embodiments is especially effective in the case when a substrate having a side or a diagonal line with a length of 500 mm or greater is an object to be exposed. Further, in the case when a substrate serving as an exposure target is like a sheet with flexibility, the sheet may be formed into a roll state.

Electronic devices such as liquid crystal display devices (or semiconductor devices) are manufactured through the steps such as: a step in which the function/performance design of a device is performed; a step in which a mask (or a reticle) based on the design step is manufactured; a step in which a glass substrate (or a wafer) is manufactured; a lithography step in which a pattern of the mask (the reticle) is transferred onto the glass substrate with the exposure apparatus in each of the embodiments described above and the exposure method thereof; a development step in which the glass substrate that has been exposed is developed; an etching step in which an exposed member of the other section than a section where resist remains is removed by etching; a resist removal step in which the resist that is no longer necessary when etching is completed is removed; a device assembly step; and an inspection step. In this case, in the lithography step, the exposure method described previously is implemented using the exposure apparatus in the embodiments described above and a device pattern is formed on the glass substrate, and therefore, the devices with a high integration degree can be manufactured with high productivity.

Incidentally, the disclosures of all the Patent Application Publications, the U.S. Patent Application Publications and the U.S. Patents related to exposure apparatuses and the like that are cited in the embodiments described above are each incorporated herein by reference.

INDUSTRIAL APPLICABILITY

As is described so far, the movable body apparatus of the present invention is suitable for moving objects. Further, the exposure apparatus of the present invention is suitable for forming predetermined patterns on objects. Further, the manufacturing method of flat-panel displays of the present invention is suitable for production of flat-panel displays. Further, the device manufacturing method of the present invention is suitable for production of microdevices.

REFERENCE SIGNS LIST

10 . . . liquid crystal exposure apparatus,
20 . . . substrate stage device,
22 . . . base frame,
24 . . . coarse movement stage,
26 . . . weight cancelling device,
28 . . . X guide bar,
32 . . . noncontact holder,
34 . . . auxiliary table,
40 . . . substrate carrier,
P . . . substrate.

The invention claimed is:

1. An exposure apparatus that performs scanning exposure of each of a plurality of areas of an object, by irradiating the object with an illumination light via an optical system and relatively driving the object with respect to the illumination light, the apparatus comprising:
   a first plate supporter that supports, in a noncontact manner, a first area and at least a partial area of a second area of the plurality of areas, the second area being arranged side by side with the first area in a first direction;
   a plate carrier that holds the object supported in a noncontact manner by the first plate supporter, at a position not overlapping the first plate supporter in a second direction intersecting the first direction;
   a first driver disposed spaced apart from the first plate supporter in the second direction, the first driver being configured to relatively drive the plate carrier that holds the object with respect to the first plate supporter in the first direction so that an other area of the second area is supported by the first plate supporter; and
   a second driver configured to drive the first plate supporter in the second direction, wherein
   the first and the second drivers are configured to drive the plate carrier and the first plate supporter, respectively, in the second direction at a time of the scanning exposure.

2. The exposure apparatus according to claim 1, wherein the first plate supporter has a size capable of supporting a substantially entire surface of the object, and
the first driver is configured to drive the plate carrier so that a supported state of the object is switchable between a first state and a second state, in the first state the substantially entire surface of the object being supported by the first plate supporter, and in the second state a partial portion of the object moving off from the first plate supporter by driving of the first driver and an other portion of the object being supported in a noncontact manner by the first plate supporter.

3. The exposure apparatus according to claim 2, wherein the first driver is configured to drive the plate carrier so that the supported state of the object is switched between the first state and the second state at the time of the scanning exposure and at a time other than the scanning exposure.

4. The exposure apparatus according to claim 3, further comprising:
a mark detector that performs a mark detection operation of detecting a plurality of marks that the object has, wherein
the first driver is configured to drive the plate carrier so that the supported state of the object is the first state at a time of the mark detection operation.

5. The exposure apparatus according to claim 1, further comprising:
a second plate supporter that supports an other area than an area supported by the first plate supporter.

6. The exposure apparatus according to claim 1, wherein the plate carrier is configured of a pair of first members and a pair of second members provided on the first members, and
the first members are provided at a position lower than the first plate supporter in a vertical direction.

7. The exposure apparatus according to claim 6, further comprising:
an encoder system that obtains position information of the plate carrier in the first and the second directions, wherein
at least one of heads and scales that configure the encoder system is provided at the plate carrier.

8. The exposure apparatus according to claim 7, wherein the one of the heads and the scales is provided at the second members.

9. The exposure apparatus according to claim 6, further comprising:
a reference member that serves as a reference when position information of the plate carrier is obtained, wherein
the reference member is provided at the first member.

10. The exposure apparatus according to claim 1, wherein the first plate supporter has a supply hole that supplies air to a lower surface of the object.

11. The exposure apparatus according to claim 10, wherein
the first plate supporter has a suction hole that suctions air intervening between the first plate supporter and the lower surface of the object.

12. The exposure apparatus according to claim 1, wherein the object is a substrate used in a flat-panel display.

13. The exposure apparatus according to claim 12, wherein
the substrate has at least a side or a diagonal line with a length of 500mm or greater.

14. A manufacturing method of a flat-panel display, comprising:
exposing the object using the exposure apparatus according to claim 1; and
developing the object that has been exposed.

15. A device manufacturing method, comprising:
exposing the object using the exposure apparatus according to claim 1; and
developing the object that has been exposed.

16. An exposure method of performing scanning exposure of each of a plurality of areas of an object, by irradiating the object with an illumination light via an optical system and relatively driving the object with respect to the illumination light, the method comprising:
supporting, in a noncontact manner, a first area and at least a partial area of a second area of the plurality of areas, by a first plate supporter, the second area being arranged side by side with the first area in a first direction;
holding the object supported by the first plate supporter in a noncontact manner, by a plate carrier at a position not overlapping the first plate supporter in a second direction intersecting the first direction;
relatively driving the plate carrier that holds the object with respect to the first plate supporter, by a first driver, so that an other area of the second area is supported by the first plate supporter, the first driver being disposed spaced apart from the first plate supporter in the second direction; and
driving the plate carrier and the first plate supporter in the second direction, respectively, by the first driver and a second driver at a time of the scanning exposure, the second driver driving the first plate supporter in the second direction.

17. The exposure method according to claim 16, wherein the first plate supporter has a size capable of supporting a substantially entire surface of the object, and
the exposure method further comprises:
controlling the first driver so that a supported state of the object is switchable between a first state and a second state, in the first state the substantially entire surface of the object being supported by the first plate supporter, and in the second state a partial portion of the object moving off from the first plate supporter by driving of the first driver and an other portion of the object being supported in a noncontact manner by the first plate supporter.

18. The exposure method according to claim 17, wherein in the controlling, the supported state of the object is switched between the first state and the second state at the time of the scanning exposure and at a time other than the scanning exposure.

19. The exposure method according to claim 18, wherein in the controlling, the first driver is controlled so that the supported state of the object is the first state at a time of a mark detection operation by a mark detector, the mark detector performing the mark detection operation of detecting a plurality of marks that the object has.

* * * * *